(12) United States Patent
Chen et al.

(10) Patent No.: US 10,636,484 B2
(45) Date of Patent: Apr. 28, 2020

(54) CIRCUIT AND METHOD FOR MEMORY OPERATION

(71) Applicant: Winbond Electronics Corporation, Taichung (TW)

(72) Inventors: Frederick Chen, Tainan (TW); Ping-Kun Wang, Taichung (TW); Chih-Cheng Fu, New Taipei (TW); Chien-Min Wu, Hsinchu (TW)

(73) Assignee: Winbond Electronics Corporation, Taichung (TW)

(*) Notice: Subject to any disclaimer, the term of this patent is extended or adjusted under 35 U.S.C. 154(b) by 0 days.

(21) Appl. No.: 16/129,744

(22) Filed: Sep. 12, 2018

(65) Prior Publication Data
US 2020/0082879 A1    Mar. 12, 2020

(51) Int. Cl.
*G11C 13/00* (2006.01)
*H01L 27/24* (2006.01)
*H03H 7/01* (2006.01)
*G11C 11/54* (2006.01)
*G11C 29/12* (2006.01)

(52) U.S. Cl.
CPC ........ *G11C 13/004* (2013.01); *G11C 13/0026* (2013.01); *G11C 13/0028* (2013.01); *H01L 27/2463* (2013.01); *G11C 11/54* (2013.01); *G11C 29/12* (2013.01); *H03H 7/0161* (2013.01)

(58) Field of Classification Search
CPC .............................. G11C 13/0069; G11C 8/10
USPC .............................................. 365/148, 230.06
See application file for complete search history.

(56) References Cited

U.S. PATENT DOCUMENTS

| | | | | |
|---|---|---|---|---|
| 4,974,146 A | * | 11/1990 | Works | G06F 9/38 712/14 |
| 5,131,072 A | * | 7/1992 | Yoshizawa | G06N 3/04 706/38 |
| 5,293,335 A | * | 3/1994 | Pernisz | G06N 3/063 365/148 |
| 5,444,822 A | * | 8/1995 | Shinohara | G06N 3/063 706/41 |
| 5,524,175 A | * | 6/1996 | Sato | G06N 3/10 706/41 |
| 5,671,336 A | * | 9/1997 | Yoshida | G06N 3/0635 706/30 |
| 5,754,738 A | * | 5/1998 | Saucedo | G06F 17/50 706/11 |
| 5,801,711 A | * | 9/1998 | Koss | G06T 15/005 345/423 |
| 6,581,049 B1 | * | 6/2003 | Aparicio, IV | G06N 3/063 706/39 |

(Continued)

OTHER PUBLICATIONS

Sourikopoulos, Ilias, et al. "A 4-fJ/spike artificial neuron in 65 nm CMOS technology." *Frontiers in neuroscience* 11 (2017): 123. (14 pages).

(Continued)

*Primary Examiner* — Michael T Tran
(74) *Attorney, Agent, or Firm* — Finnegan, Henderson, Farabow, Garrett & Dunner, L.L.P.

(57) ABSTRACT

A memory device including a plurality of memory units; at least one geometric mean operator coupled to at least two of the plurality of memory units; and a memory state reader coupled to the at least one geometric mean operator to read a memory state of the plurality of memory units.

20 Claims, 16 Drawing Sheets

(56) References Cited

U.S. PATENT DOCUMENTS

| | | | | |
|---|---|---|---|---|
| 6,661,908 B1* | 12/2003 | Suchard | | G06K 9/00154 348/161 |
| 6,684,298 B1* | 1/2004 | Dwarkadas | | G06F 12/0864 711/128 |
| 7,028,271 B2* | 4/2006 | Matsugu | | G06K 9/00281 382/181 |
| 7,295,517 B2* | 11/2007 | Anim-Appiah | | H04L 1/206 370/208 |
| 7,317,433 B2* | 1/2008 | Chen | | G09G 3/3233 315/169.3 |
| 7,444,562 B2* | 10/2008 | Lattmann | | H04L 45/00 714/718 |
| 8,174,865 B2* | 5/2012 | Rhie | | G11C 7/062 365/148 |
| 8,443,169 B2* | 5/2013 | Pechanek | | G06F 9/3001 712/11 |
| 8,781,810 B2* | 7/2014 | Cancedda | | G06F 17/2881 704/2 |
| 9,245,353 B2* | 1/2016 | Kalevo | | G06T 9/00 |
| 9,330,355 B2* | 5/2016 | Rangan | | G06N 3/049 |
| 9,524,461 B1* | 12/2016 | Huynh | | G06N 3/008 |
| 9,585,637 B2* | 3/2017 | Noguchi | | A61B 8/5207 |
| 9,786,367 B2* | 10/2017 | Cagli | | G11C 13/004 |
| 9,842,302 B2* | 12/2017 | Bates | | G05B 23/024 |
| 9,854,168 B2* | 12/2017 | Wu | | H04N 5/23267 |
| 9,898,207 B2* | 2/2018 | Kim | | G06F 3/0611 |
| 10,255,656 B2* | 4/2019 | Appu | | G06F 9/30014 |
| 10,289,950 B2* | 5/2019 | Hosokawa | | G06N 3/063 |
| 10,332,004 B2* | 6/2019 | Kataeva | | G06N 3/084 |
| 10,332,179 B2* | 6/2019 | Desmarais | | A41H 3/007 |
| 10,346,347 B2* | 7/2019 | Lu | | H03K 19/177 |
| 10,353,706 B2* | 7/2019 | Kaul | | G06F 7/483 |
| 10,412,626 B2* | 9/2019 | Muehlmann | | H04B 7/0848 |
| 10,467,795 B2* | 11/2019 | Sarel | | G06T 15/005 |
| 10,497,084 B2* | 12/2019 | Appu | | G06F 9/544 |
| 2011/0153533 A1* | 6/2011 | Jackson | | G06N 3/0635 706/17 |
| 2012/0011090 A1* | 1/2012 | Tang | | G06N 3/049 706/33 |
| 2012/0317063 A1* | 12/2012 | Sim | | G06N 3/063 706/27 |
| 2016/0322101 A1 | 11/2016 | Sacchetto et al. | | |
| 2017/0003889 A1* | 1/2017 | Kim | | G06F 3/0611 |
| 2017/0315924 A1* | 11/2017 | Blount | | G06F 12/10 |
| 2018/0115824 A1* | 4/2018 | Cassidy | | H04R 1/22 |
| 2019/0083067 A1* | 3/2019 | Kim | | A61B 8/5207 |
| 2019/0174268 A1* | 6/2019 | Karam | | G01S 5/02 |

OTHER PUBLICATIONS

Siskos, S., S. Vlassis, and I. Pitas. "Analog implementation of fast min/max filtering." *IEEE Transactions on Circuits and Systems II: Analog and Digital Signal Processing* 45.7 (Jul. 1998): 913-918.

Partzsch, Johannes, et al. "A fixed point exponential function accelerator for a neuromorphic many-core system." *Circuits and Systems (ISCAS), 2017 IEEE International Symposium.* IEEE, 2017. . . (4 pages).

Popa, Cosrnin Radu. "Voltage and Current Multiplier Circuits." *Synthesis of Computational Structures for Analog Signal Processing.* Springer, New York, NY, 2012. 89-184.

Indiveri, Giacomo et al. "ReRAM-based neuromorphic computing." in *Resistive Switching: From Fundamentals of Nanoionic Redox Processes to Memristive Device Applications* (2016): 715-735.

Boybat, Irem, et al. "Neuromorphic computing with multi-memristive synapses." *Nature communications* 9.1 (2018): 2514. (14 pages).

* cited by examiner

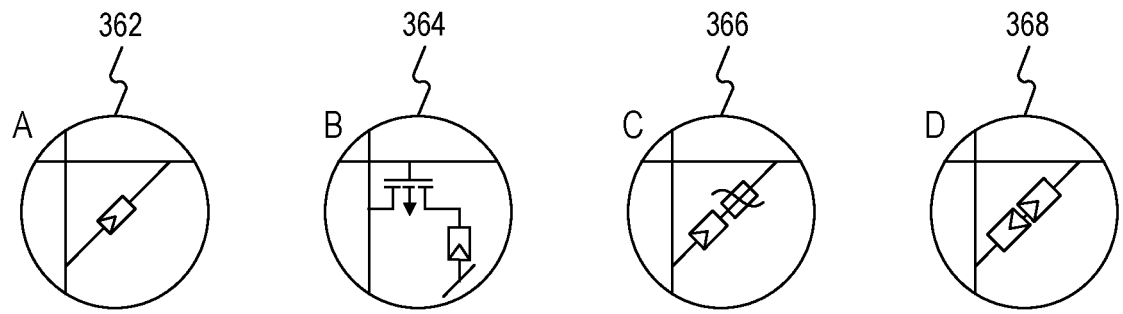
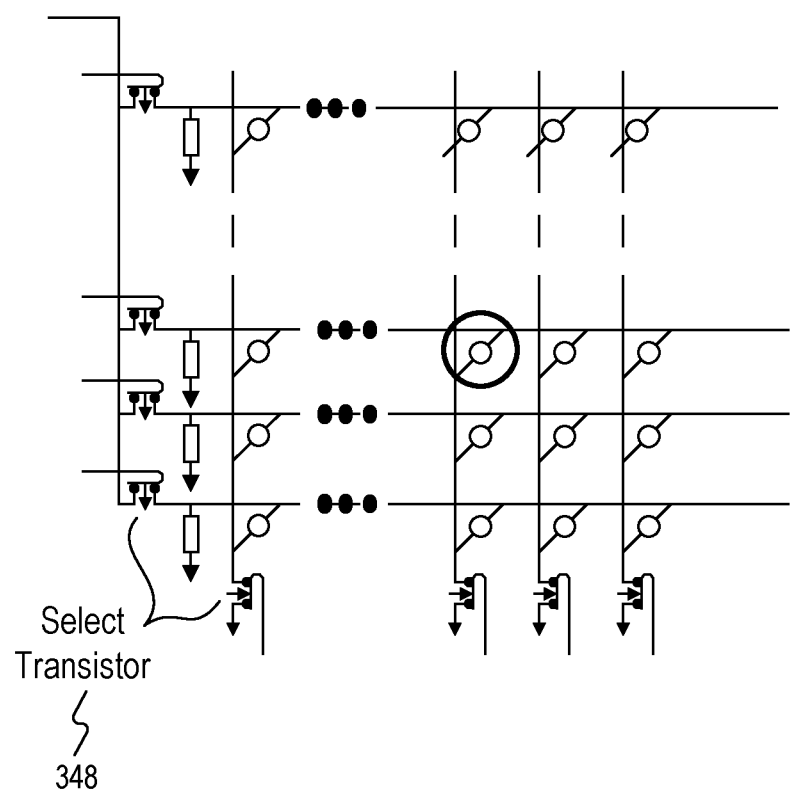
FIG. 3C

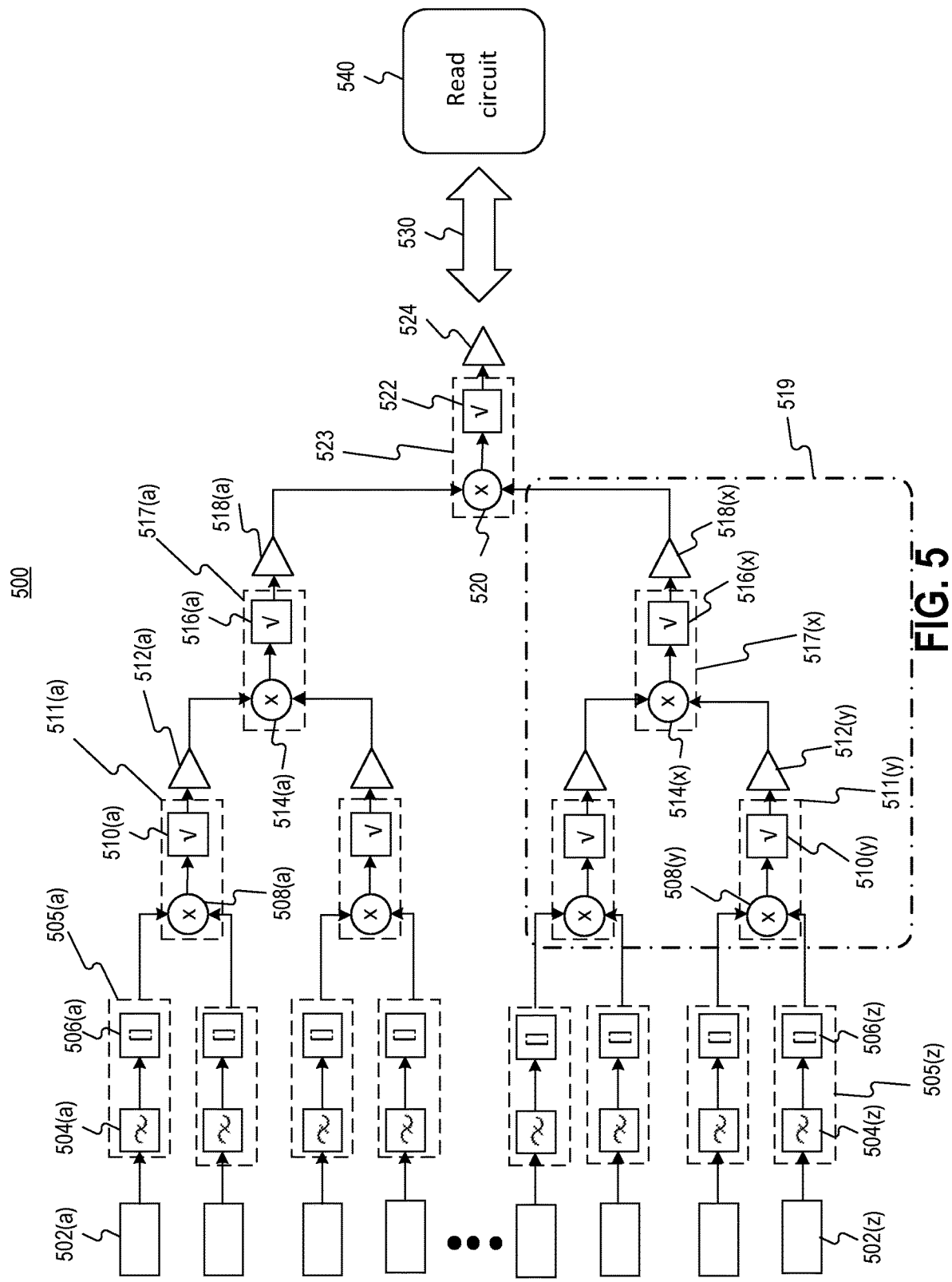

CIRCUIT AND METHOD FOR MEMORY OPERATION

FIELD OF THE DISCLOSURE

The present disclosure relates to a circuit configuration and method to read memory units of a memory device and, more particularly, to a circuit configuration and method to read a state of a plurality of memory units of a memory device.

BACKGROUND

Non-volatile memory devices store information by altering the electrical characteristics of electronic components that compose memory cells. For example, a flash memory stores information by modifying the threshold voltage of transistors in a memory cell. In flash memory, a low threshold voltage in a cell may represent a logic "0," while a high threshold voltage may represent a logic "1." Therefore, in order to retrieve information stored in the memory cells it is necessary to query the electrical characteristic of the electronic components in the memory cell. For instance, reading the state of a flash memory involves measuring the threshold voltage of the transistors to determine whether they store "0" or "1."

Nowadays, reading the states of memory cells can be challenging because memory cells are designed to store several states. For example, quad-level cells store 16 different states. With multiple states in each cell, the difference between electrical characteristics associated with each state may be very small and require highly precise read circuitry to resolve differences. Moreover, intrinsic fluctuations or noise of electronic components complicate the determination of a memory state. For instance, some memory cells include resistive switches that may have overlapping distributions between memory states. For example, in a resistive memory a memory state of "0" may be associated with a 10-20Ω distribution while a memory state of "1" may be associated with a 15-25Ω distribution. These overlapping memory state distributions make the read operation unreliable when obtaining an overlapping read (e.g., 18Ω) from memory cells. In these kinds of situations, it may be required to add error correction circuits, or perform multiple reads before a memory state may be accurately identified.

These problems are particularly difficult to address in non von-Neumann computer architectures. In von-Neumann architectures a memory wall separates the memory and processing units. This arrangement allows employing memory reading techniques that include data correction, filtering, or signal amplification because data from the memory may be accessed in advance of an operation, processed, and then stored in cache for later access. However, in non von-Neumann architectures there is no memory wall between the memory and processing units and it is difficult to efficiently correct errors or to buffer data from the memory devices before it is transmitted to the processing units. In non von-Neumann architectures, such as neuro-inspired architectures, memory cells are placed next to processing units, to avoid memory bottle necks. Therefore, there is no opportunity to effectively buffer data from the memory for the processing units. Indeed, any attempt to buffer or correct data from the memory for processing units may result in significant delays that undermine computer operation.

Moreover, non von-Neumann architectures may benefit from memory types that are challenging to read due to intrinsic fluctuations. For example, the neuro-inspired architectures would benefit from using resistive switching non-volatile memory elements. These memory elements are difficult to read because they may have overlapping memory states as described above. Nonetheless, employing these type of memory elements in neuro-inspired architectures is desirable to facilitate execution of neural network operations because they resemble bio-inspired synapses. Therefore, to improve non von-Neumann architectures, it is desirable to develop read circuitry that allows utilizing resistive memory elements, even if they have overlapping memory state distributions.

The disclosed memory devices, circuits, and methods are directed to mitigating or overcoming one or more of the problems set forth above, among other problems in the prior art.

SUMMARY

One embodiment of the present disclosure is directed to a memory device. The memory device includes a plurality of memory units; at least one geometric mean operator coupled to at least two of the plurality of memory units; and a memory state reader coupled to the at least one geometric mean operator to read a memory state of the plurality of memory units.

Another aspect of the present disclosure is directed to a memory device. The memory device includes a plurality of non-volatile memory units; means for generating a first product by multiplying memory read currents associated with the memory units; means for generating a first root by performing a root operation on the first product; and means for determining a memory state of the plurality of memory units based on a memory current corresponding to the first root.

Yet another aspect of the present disclosure is directed to a method for determining a memory state. The method includes obtaining a plurality of memory read currents from a plurality of memory units; determining a product based on the plurality of memory read currents; determining a root based on the product; and determining the memory state based on the root.

BRIEF DESCRIPTION OF THE DRAWINGS

FIG. 3C is a schematic diagram of a third exemplary memory circuit.

FIG. 5 is a schematic diagram of a first exemplary memory read configuration.

DETAILED DESCRIPTION

The disclosure is generally directed to a memory device and memory circuitry that cluster the output of multiple memory units in order to narrow the distribution of memory states. While individual memory elements may have wide and overlapping memory state distributions, the overall output of multiple memory units may be processed to create a finer distribution. The disclosed memory devices may accurately determine an overall memory state, even when it may be difficult to distinguish between memory states of individual memory units, by processing groups of memory units. Moreover, processing circuits in the memory device may generate distributions without overlap by reducing the distribution spread and filtering memory unit outputs with an abnormal distribution.

The disclosed memory devices and memory read circuits may also be able to quickly perform required data processing for narrowing the data distribution. For instance, by employing analog circuits, or other dedicated hardware, the memory device may be able to process signals from memory elements quickly and seamlessly to provide data to read circuits that determine a memory state.

Figure 1:
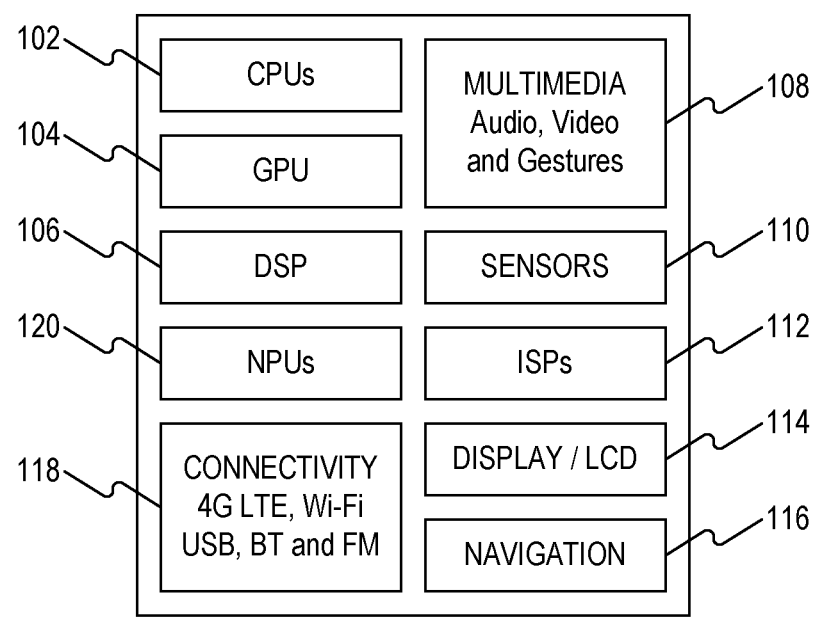
FIG. 1 is a schematic diagram of an exemplary electronic system, according to one embodiment.

FIG. 1 is a schematic diagram of an exemplary electronic system 100, according to one embodiment. Electronic system 100 may include one or more of a central processing unit (CPU) 102, a graphical processing unit (GPU) 104, a digital signal processor (DSP) 106, and a Multimedia processor 108. In addition, electronic system 100 may include one or more of sensors 110, an image signal processor (ISP) 112, a display/LCD 114, a navigation module 116, and a connectivity module 118. Thus, electronic system 100 may include fewer than all of the elements shown in FIG. 1 and/or additional elements not shown in FIG. 1. Furthermore, electronic system 100 may include a neural processing unit (NPU) 120.

In some embodiments, each one of the components of electronic system 100 may be connected to each other of the components of electronic system 100 and may be housed in a single device. For example, CPU 102 may be connected independently to all the other components of electronic system 100. However, in other embodiments, electronic system 100 may have specific connections and distribute components in multiple devices. For example, in some embodiments display/LCD 114 may only be connected to multimedia processor 108, or navigation 116 may be in a different device and only be connected with connectivity module 118.

CPU 102 may be assembled by electronic circuitry configurable to execute instructions of a computer program. For example, CPU 102 may be configured to perform arithmetic, logical, control and input/output (I/O) operations specified by a set instructions. In some embodiments, CPU 102 may include an arithmetic logic unit (ALU) that performs arithmetic and logic operations, processor registers that supply operands to the ALU and store the results of ALU operations, and a control unit that orchestrates the fetching (from memory) and execution of instructions by directing the coordinated operations of the ALU, registers, and other components. Additionally, or alternatively, CPU 102 may also include one or more microprocessors and peripheral interfaces. Moreover, in some embodiments, CPU 102 may additionally include a multi-core processor that may be configured to operate in parallel.

GPU 104 may be designed with electronic circuits designed to rapidly manipulate and alter memory devices to accelerate the creation of images in a frame buffer. For example, GPU 104 may include circuitry for basic 2D acceleration and framebuffer circuitry. In some embodiments, GPU 104 may simulate the 2D acceleration. In yet other embodiments, GPU 104 may be configured for texture mapping and rendering polygons, accelerating geometric calculations such as the rotation, and translating vertices into different coordinate systems.

GPU 104 may be set up as a plug-in card, in a chipset on a motherboard, or in the same chip as CPU 102. Moreover, GPU 104 may be directly connected to display/LCD 114.

DSP 106 may be assembled with specialized microprocessors for operational needs of digital signal processing. DSP 106 may be configured to process data in real time, for applications that require fast processing without significant delays. DSP 106 may also include circuitry to receive digital signals and process them to improve the signals to provide clearer sound, faster data transmissions, or sharper images. In some embodiments, DSP 106 may receive video, voice, audio, temperature or position signals from, for example, sensors 110, that have been digitized, and perform mathematical functions on them. In such embodiments, DSP 106 may be designed to perform these mathematical functions rapidly.

Multimedia processor 108 may include a microprocessor or a system-on-a-chip designed to provide digital streaming at real-time rates. In some embodiments, multimedia processor 108 may be configured to handle files including uncompressed video, compressed digital video—e.g. MPEG-1, MPEG-2, MPEG-4, etc., and digital audio—e.g. PCM, AAC, etc. A microprocessor in multimedia processor 108 may be optimized to accommodate different media datatypes, for example by including a memory interface, streaming media interfaces, or specialized functional units to accommodate various digital media codecs. For example, multimedia processor 108 may include vector processing or SIMD functional units to efficiently accommodate these media datatypes, and/or DSP-like features.

Sensors 110 may include a plurality of sensing units that transduce external events and transmit them to a processing unit in electronic system 100 such as CPU 102 or DSP 106. Sensors 110 may include one or more of an accelerometer, a gyroscope, a digital compass, a barometer, a finger print recognition sensor, an iris (eye) scanning sensor, and/or a facial recognition sensor. In addition, sensors 110 may include cameras and microphones. Additionally, or alternatively, sensors 110 may include a GPS unit, a magnetometer, a lux meter, and/or a proximity sensor.

ISP 112 may include a specialized processor for image processing. ISP 112 may employ parallel computing utilizing SIMD or MIMD technologies to increase speed and efficiency. ISP 112 may be configured to perform image processing tasks such as increasing system integration on embedded devices. In some embodiments, ISP 112 may be disposed on the same board as other elements of electronic system 100. For example, ISP 112 may be on the same board as CPU 102. However, in other embodiments, ISP 112 may be a discrete unit. ISP 112 may include circuitry to control a CMOS sensor. For example, ISP 112 may include circuitry for performing image processing operations such as demosaicing, autofocus, auto-exposure, and white balance. In addition, ISP 112 may have noise reduction, filtering, and high-dynamic-range (HDR) capabilities.

Navigation module 116 may include hardware with radar and/or GPS equipment to record locations. For example, navigation module 116 may be either GPS based, ground beacon based, or DMI (Distance Measurement Instrument). Navigation module 116 may be configured to determine the current location of electronic system 100. Additionally, or alternatively, navigation module 116 may include data storage to store navigation map information. Navigation module 116 may also be integrated within certain elements of electronic system 100. For example, navigation module 116 may be integrated within CPU 102. In some embodiments, navigation module 116 may be connected to display/LCD 114 and may be connected through the Internet via, for example, connectivity module 118, to geolocation services.

Connectivity module 118 may include antennas, microcontrollers, and data ports for wireless or wired communication. For example, connectivity module 118 may include antennas for 4G LTE, WIFI, and FM communication. Alternatively, or additionally, connectivity module 118 may include USB communication. In some embodiments, connectivity module may include a processor that connects over a standard peripheral interface, which may include an Inter-Integrated Circuit (I2C) interface, a Serial Peripheral Interface (SPI), a Universal Asynchronous Receiver/Transmitter (UART) interface, a High-Speed Inter-Chip (HSIC) interface, or another suitable standard interface that the processor executes or otherwise supports. Furthermore, connectivity module 118 may provide a command protocol to provide services associated with a communication framework needed to connect a processing unit, such as CPU 102 or GPU 104, to external IoT devices, cloud services, etc.

NPU 120 may include an electronic platform for brain-inspired computing (i.e., neuromorphic computing). NPU 120 may include an artificial intelligence accelerator chip and be associated with a software API to interact with the platform. In some embodiments, NPU 120 may be configurable to execute machine learning algorithms such as deep learning. Moreover, NPU 120 may be configured to execute operations of image and sound processing, including speech recognition. In some embodiments, NPU 120 may be constructed with a microprocessor that specializes in the acceleration of machine learning algorithms. For example, NPU 120 may be configurable to operate on predictive models such as artificial neural networks or random forests.

Figure 2:
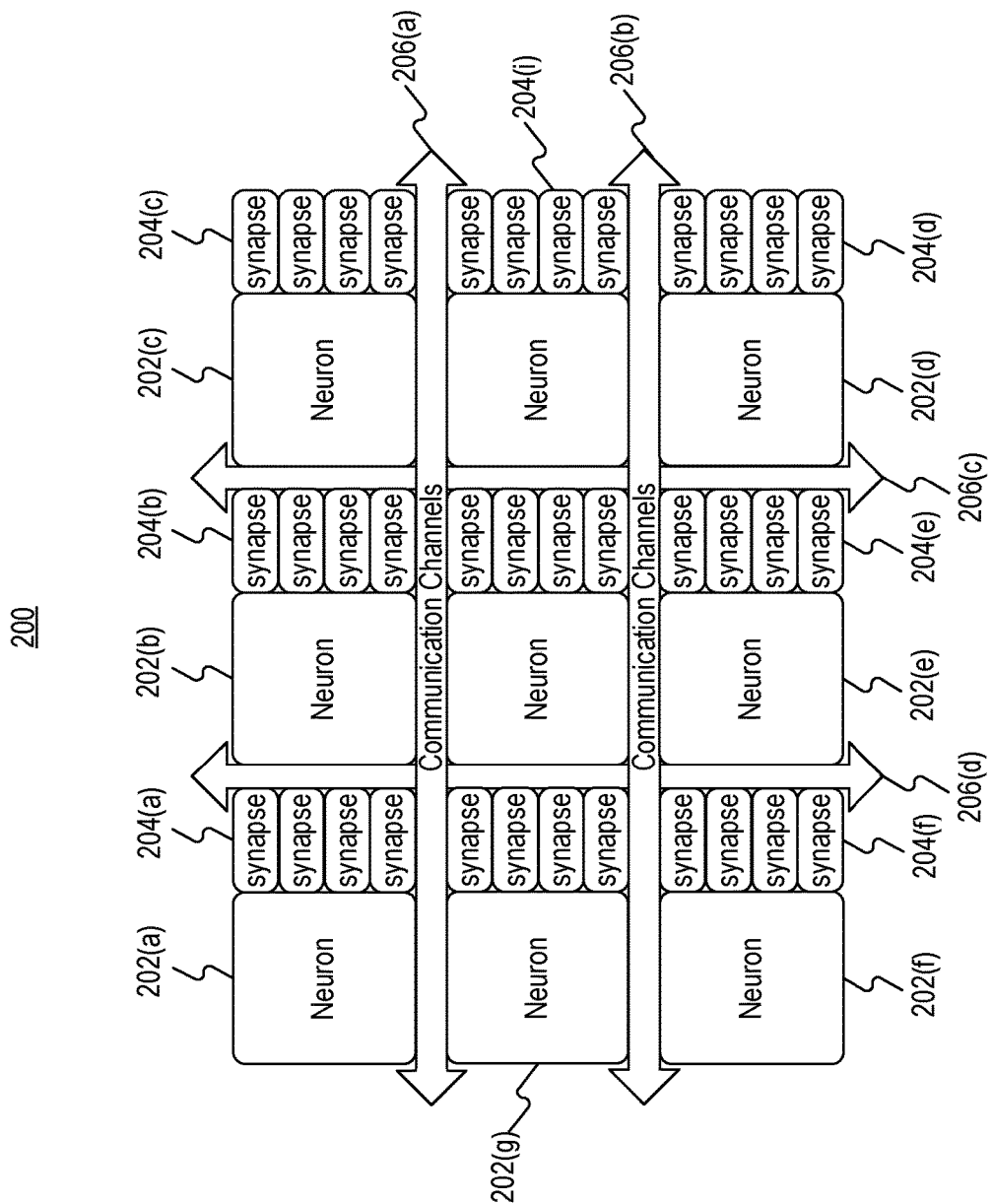
FIG. 2 is a schematic diagram of an exemplary memory device.

FIG. 2 is a schematic diagram of an exemplary memory device 200. In some embodiments, memory device 200 may be part of electronic system 100. For instance, memory device 200 may constitute NPU 120. However, in other embodiments, memory device 200 may be a standalone unit. Memory device 200 may include a plurality of neurons 202, a plurality of synapses 204, and a plurality of communication channels 206.

Exemplary memory device 200 in FIG. 2 includes nine neurons 202, including neuron 202(a), 202(b), 202(c) . . . , 202(g). However, other embodiments with more neurons 202, or less neurons 202, are also possible. Neurons 202 may be designed with digital or analog circuits that mimic neural operations. In some embodiments, neurons 202 may include CMOS digital circuits configured to perform logic operations of neuron state and activation functions. Alternatively, neurons 202 may include analog circuits including MOS or BJT transistors configured to operate in subthreshold states for a non-linear voltage-controlled conductance. Different implementations of neurons 202 are further described in connection with FIG. 4.

Synapses 204 include synapses 204(a), 204(b), . . . , 204(f) and may include electronic components of variable resistance. However, other embodiments with more synapses 204, or less synapses 204, are also possible. Synapses 204 may be coupled with neurons 202 and between themselves. In some embodiments, synapses 204 may include a ReRAM memory grid or array further described in connection with FIGS. 3A-3C. In other embodiments, synapses 204 may include a flash memory grid in which transistors in the flash memory cells are controlled by gate voltage to act as a resistance. In such embodiments, the transistor channel can be configured to act as a gate-controllable resistor.

Communication channels 206 include channels 206(a), 206(b), . . . , and 206(d) and may include parallel and/or serial data buses. However, other embodiments with more communication channels 206, or less communication channels 206, are also possible. In some embodiments, communication channels 206 may include dedicated buses between components of memory device 200. For instance, communication channel 206(a) may include dedicated communication lines between neuron 202(a) and neuron 202(b).

In some embodiments, each one of the neurons 202 may be coupled to a plurality of synapses 204. For example, while FIG. 2 shows each one of neurons 202 coupled to four synapses 204, each one of neurons 202 may be coupled to one hundred or more synapses 204. In these embodiments, synapses 204 may be coupled directly or indirectly to neurons 202. For example, synapse 204(a) may be connected directly to neuron 202(a) with on-chip interconnects. However, in other embodiments, synapse 204(a) may be coupled to neuron 202(a) through a buffering circuit, other synapses, or filtering circuits.

Because neurons 202 may have more electronic components than synapses 204, neurons 202 may occupy an area larger than the area occupied by synapses. For example, in some embodiments neurons 202 may occupy an area at least one hundred times larger than the synapses. While each synapse 204 may be a single electronic component, such as a ReRAM unit or a flash cell, each one of neurons 202 may include several transistors, current sources, and capacitors. For example, each one of neurons 202 may occupy an area of 8000 $F^2$ or more while each one of synapses 204 may occupy an area of 30 $F^2$ or less, where $F^2$ is a relative area unit that represents the smallest resolvable feature for a technology node.

As shown in FIG. 2, memory device 200 may place neurons 202 with associated synapses 204 near to each other to minimize the length of any communication lines between memory units, such as synapses 204, and processing units, such as neurons 202. Nonetheless, communication channels 206 may additionally connect processing units with longer communication lines.

Figure 3A:
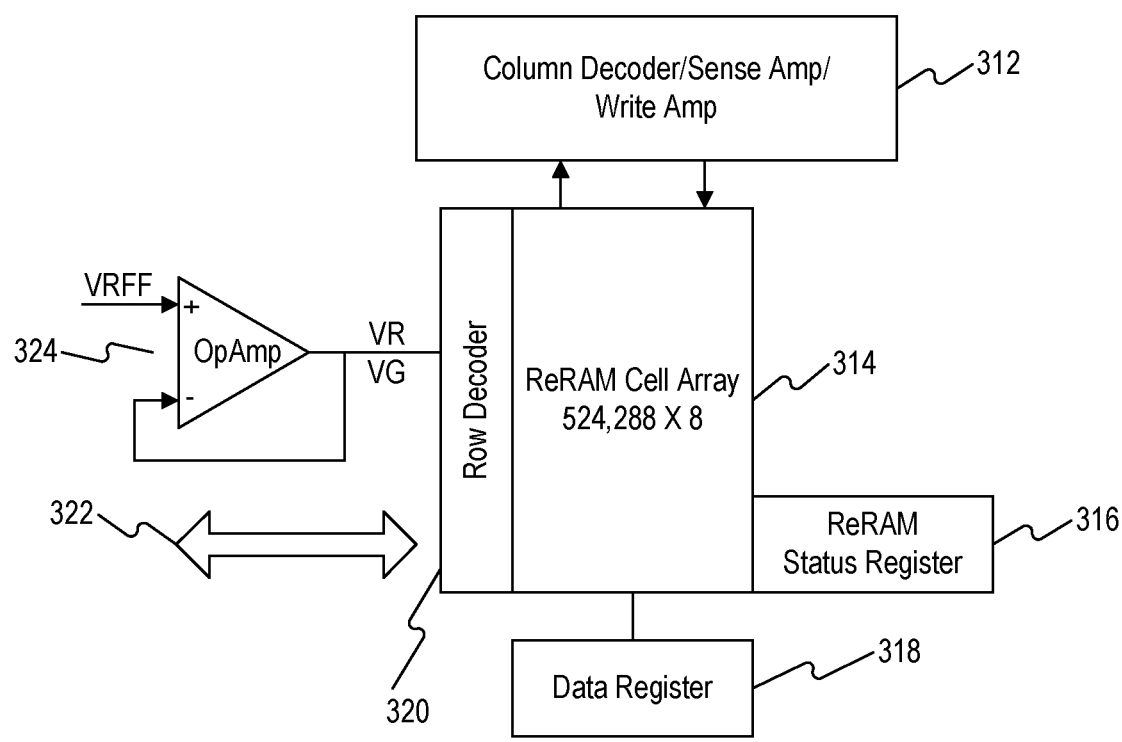
FIG. 3A is a schematic diagram of a first exemplary memory circuit.

FIG. 3A is a schematic diagram of a first exemplary memory circuit 310. Memory circuit 310 includes a column decoder 312, a ReRAM register 316, a data register 318, and a row decoder 320, connected to a ReRAM array 314. In addition, memory circuit 310 includes an amplifier 324 and a data bus 322, which are both connected to row decoder 320.

ReRAM array 314 includes non-volatile random-access memory units that work by changing the resistance across a solid-state material. For example, ReRAM array 314 may be assembled with a plurality of memristors. Alternatively, ReRAM array may include a grid or crossbar of resistive elements with controllable resistance. For example, ReRAM array may include a 3D Xpoint array. Alternatively, or additionally, ReRAM array 314 may be designed with a dedicated MOSFET transistor in a 1T1R structure, in which a transistor provides exclusive access to ReRAM units.

Column decoder 312 includes switches and/or multiplexers to establish electrical communication with a plurality of bit lines to read data from, and write data to, the memory units in ReRAM array 314. Column decoder 312 also includes amplifiers to drive voltages or currents during read and write operations. For example, column decoder 312 may include sensing amplifiers and write amplifiers.

ReRAM register 316 includes hardware configured to store information about the state of ReRAM array 314. Individual bits in ReRAM register 316 may be implicitly or explicitly read and/or written by machine code instructions executing on ReRAM array 314. For example, in some embodiments ReRAM register may store a collection of status flag bits for a processor.

Data register 318 includes a memory buffer that stores the data being transferred to and from ReRAM array 314. Data register 318 enables immediate access to information that may be used repetitively. For example, data register 318 may contain the copy of designated memory units in ReRAM array 314 as specified by column decoder 312. In some embodiments, employing data register 318 as part of memory circuit 310 may allow neurons 202 faster access to information that is frequently needed by avoiding required configuration of decoders.

Row decoder 320 includes circuitry to establish electrical connections between memory units in ReRAM array 314 and other read elements, such as amplifier 324 or data bus 322. Row decoder 320 may operate with analog or digital methods, or partially analog and partially digital methods. Row decoder 320 may include one or more multiplexers and be directly connected to data register 318.

To read data and transmit it to, for example, neurons 202, memory circuit 310 may include amplifier 324 and data bus 322. In exemplary memory circuit 310, amplifier 324 includes an operational amplifier configured as a driver and data bus 322 coupled to processing units.

Figure 3B:
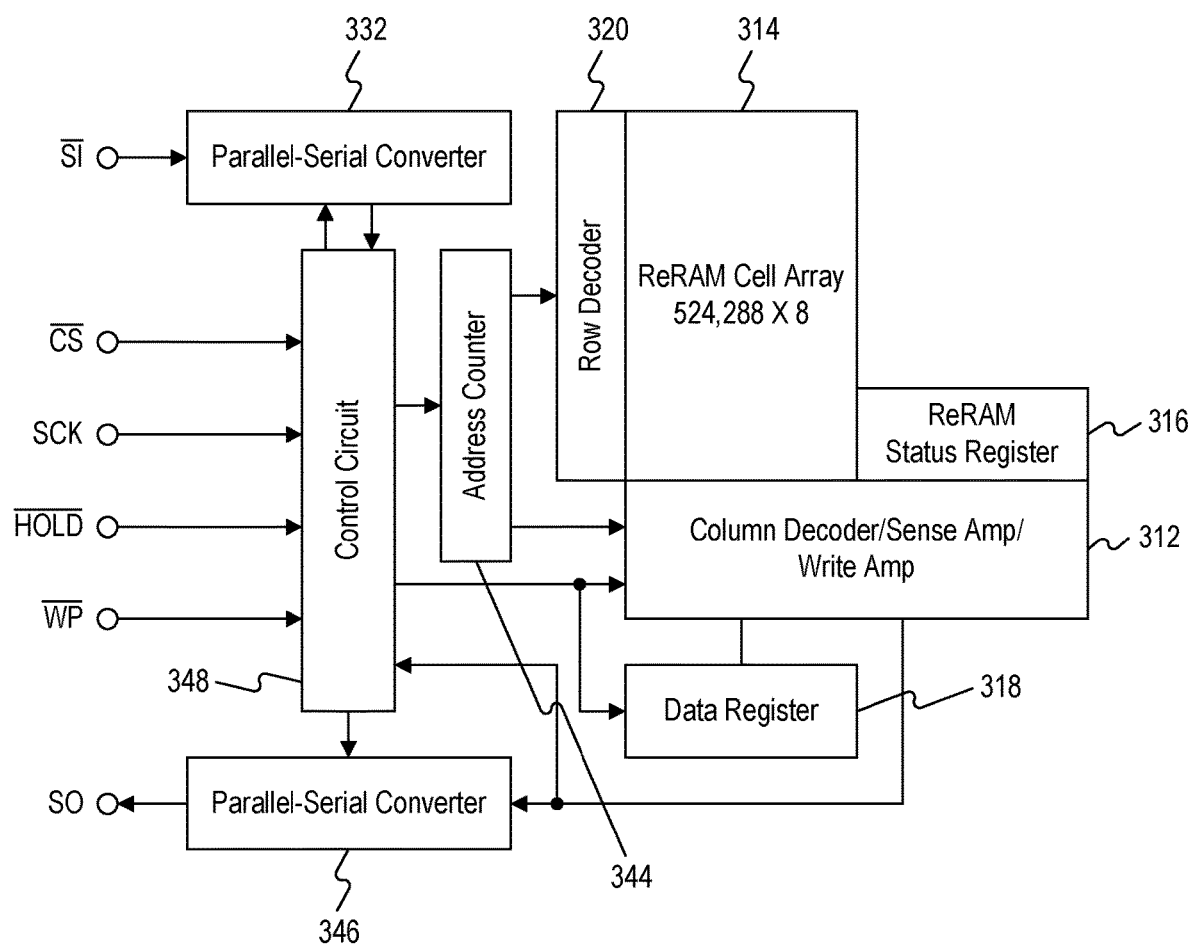
FIG. 3B is a schematic diagram of a second exemplary memory circuit.

FIG. 3B is a schematic diagram of a second exemplary memory circuit 330. Memory circuit 330 includes similar elements as memory circuit 310, including column decoder 312, ReRAM register 316, data register 318, and row decoder 320, connected to ReRAM array 314. However, memory circuit 330 implements a different memory control utilizing an address counter 344, a control circuit 348, and parallel-serial converters 332 and 346. Moreover, in memory circuit 330 components may have a different arrangement. As shown in FIG. 3B, data register 318 in memory circuit 330 is connected to column decoder 312 instead of being connected to ReRAM array 314 and row decoder 320.

Address counter 344 includes hardware that computes column and row addresses needed based on control circuit 348 instructions. In some embodiments, address counter 344 includes programmable and/or fixed offset registers to the row and/or column address respectively present. For example, as shown in FIG. 3B, address counter 344 may be connected to row decoder 334 and column decoder 340. Address counter 344 may include a multiplexer which generates high-frequency control signals based on low-frequency input signals provided by control circuit 348.

Parallel-serial converters 332 and 346 may include flip-flops, latches, and/or registers configured to transfers bits from an input in parallel or series according to a clock signal. For instance, if there is a high signal (logic 1) at the input of a flip-flop of parallel-serial converters 332 or 346, then when the clock edge transitions from low to high the logic 1 at the input is transferred to a parallel terminal. Moreover, parallel-serial converters 332 and 346 may be coupled with serial inputs (SI) or serial outputs (SO), converting data that may then be transferred to processing units.

Control circuit 348 is a digital circuit that manages the flow of data going to and from ReRAM array 314. In some embodiments, control circuit 348 may be assembled with a microcontroller or a processing unit. Moreover, control circuit 348 may provide means for determining a memory state based on a measured memory current. In addition, control circuit 348 may communicate with other components through data pins such as chip select (CS), clock signal (SCK), interrupt (HOLD), and write protect (WP) pins.

FIG. 3C is a schematic diagram of a third exemplary memory circuit 360. Memory circuit 360 shows possible implementations of ReRAM memory units in ReRAM array 314. Although not shown in FIG. 3C, like memory circuit 310, memory circuit 360 may also include amplifier 324, row decoder 320, and column decoder 312 and the other electronic devices for reading ReRAM array 314. Memory circuit 360 also may include select transistors 348 used by decoders to arrange connections between the memory units.

In some embodiments, memory units in ReRAM array 314 in memory circuit 360 are designed with cross nets. For example, ReRAM array 314 may include nanowire crossbars that are connected to CMOS wiring for reading and writing. The nanowire crossbars have a controllable resistivity. However, as shown in FIG. 3C memory units in ReRAM array 314 may be also assembled with resistive switches (A), vertical transistors (B), series-to-resistive switches (C), or complementary resistive switches (D). Alternative implementations using different types of electrical components with adaptable resistivity may also be used to build ReRAM array 314.

Figure 4A:
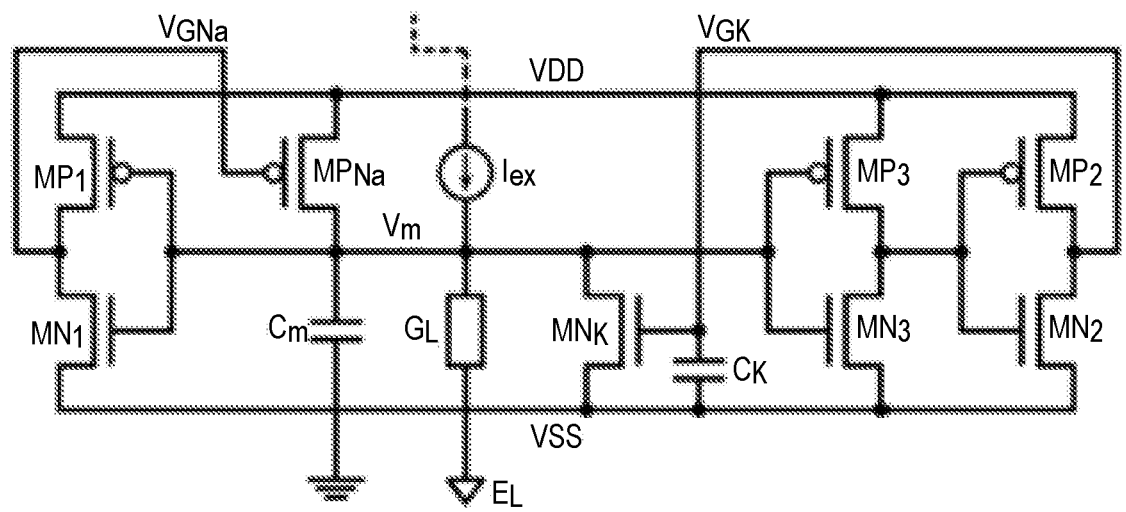
FIG. 4A is a circuit diagram of a first exemplary artificial neuronal processing unit.
Figure 4B:
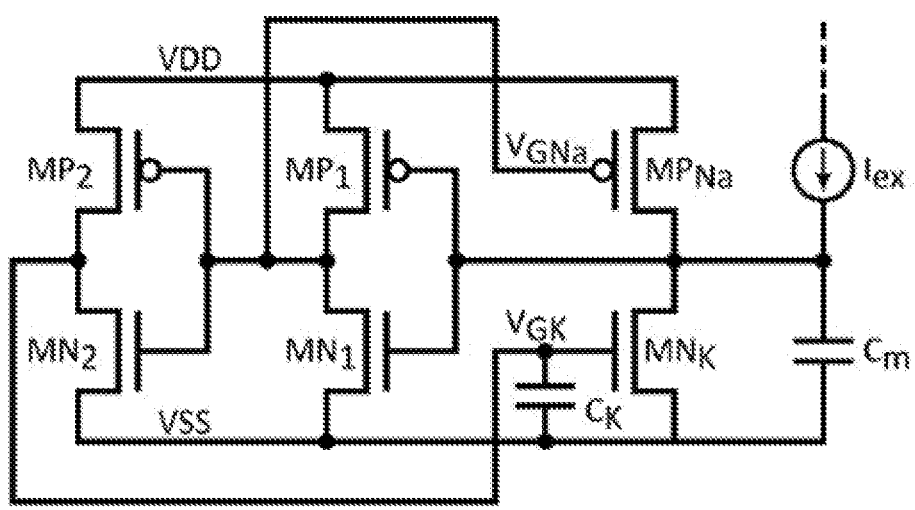
FIG. 4B is a circuit diagram of a second exemplary artificial neuronal processing unit.

FIGS. 4A and 4B illustrate circuit diagrams of exemplary artificial neuronal processing units including a biometric artificial neuron 410 and a simplified artificial neuron 420. In some embodiments, neurons 202 may be composed with biometric artificial neuron 410 or simplified artificial neuron 420.

With reference to FIG. 4A, biometric artificial neuron 410 includes a plurality of PMOS and NMOS transistors (MP and MN), connected to capacitors (Cm and $C_k$) and a load ($G_L$). Biometric artificial neuron 410 includes positive and negative feedback loops and cascaded inverters. In addition, biometric artificial neuron 410 includes an excitation current (Iex), which can be provided as a single transistor current source.

With reference to FIG. 4B, simplified artificial neuron 420 represents an alternative implementation for neurons 202. Simplified artificial neuron 420 may reduce the footprint of biometric artificial neuron 410 by modifying characteristics of the feedback loops (e.g., dynamics, threshold voltage, etc.). Like biometric artificial neuron 410, simplified artificial neuron 420 includes transistors configured as inverters, capacitors, and an excitation current. However, simplified artificial neuron 420 reduces the number of inverters by including additional loops in the circuit.

Biometric artificial neuron 410 and simplified artificial neuron 420 are examples of potential implementations of processing units in memory devices. However, they are only two of multiple alternatives that may be possible to assemble neurons 202 or equivalent processing units. For example, instead of being designed with the analog circuits shown in FIGS. 4A and 4B, neurons 202 may be designed with digital circuits.

FIG. 5 is a schematic diagram of a first exemplary memory read configuration 500. Memory read configuration 500 is used for processing readings from multiple memory units and for determining an overall state of the memory units. The grouping or clustering of memory readings in memory read configuration 500 facilitates the determination of memory states because it reduces deviation and max/min ratio of the distribution of the memory states. That is, aggregating currents from multiple memory units results in finer memory state distributions that facilitate the determination of the memory state by read circuitry. Memory read configuration 500 enables clustering and processing of multiple memory units in a series of stages. In each stage of memory read configuration 500 the current of the memory units is processed to yield a composite reading that has a lower variation and an easily identifiable state. The current distributions that result from utilizing memory read configuration 500 will be discussed in greater detail in connection with FIG. 13.

Memory read configuration 500 includes memory units 502(*a*), . . . , 502(*z*), collectively referred to herein as memory units 502, filtering circuits 505(*a*), . . . , 505(*z*), collectively referred to herein as filtering circuits 505, and first-stage geometric mean operators 511(*a*), . . . , 511(*y*), collectively referred to herein as geometric mean operators 511. In addition, memory read configuration 500 includes second-stage geometric mean operators 517(*a*), . . . , 517(*x*), collectively referred to herein as geometric mean operators 517, and a third-stage geometric mean operator 523. As shown in FIG. 5, the geometric mean operators may be organized in cascading stages having first-stage geometric mean operators 511, second-stage geometric mean operators 517, and third-stage geometric mean operator 523. While only three stages are shown in FIG. 5, memory read configuration 500 may include more stages. In such embodiments, the last stage can be coupled directly or indirectly to read circuitry. Furthermore, memory read configuration 500 includes first-stage buffer circuits 512(*a*), . . . , 512(*y*), collectively referred to herein as first-stage buffer circuits 512, second-stage buffer circuits 518(*a*), . . . , 518(*x*), collectively referred to herein as second-stage buffer circuits 518, and a third-stage buffer circuit 524. The buffer circuits may be similarly organized in stages. Moreover, memory read configuration 500 includes a data bus 530, and read circuitry 540.

Literals used to reference individual elements in FIG. 5, e.g., (x), (y), or (z), do not specify the number of an element or the total number of elements in memory read configuration 500. Instead, they are variable references that indicate a variable element number and a variable number of total elements. For example, literal (z) used to reference memory unit 502(*z*) does not indicate that memory unit 502(*z*) is the $26^{th}$ memory unit. Instead, (z) is a variable reference that could indicate any integer number. Therefore, memory unit 502(*z*) is any one of memory units 502 and the number of memory units 502 in memory read configuration 500 is any integer. Similarly, literals (y) and (x) used to reference, for example, first-stage geometric mean operators 511 (*y*) or second-stage geometric mean operators 517(*x*), are also variable references that do not indicate or limit the element number or the total number of elements.

In some embodiments, however, the literals used as variable references may have an algebraic relationship. For example, in some embodiments the variable references satisfy the relationship $(z)>(y)>(x)$. In other embodiments, the variable references satisfy the relationship $z=2(y)=4(x)$. In yet other embodiments, the variable references satisfy the relationship $(z)>(y)+1>(x)+1$.

Moreover, in some embodiments different stages of operation may be aggregated in a single stage that performs equivalent functions. While FIG. 5 shows discrete first-stage geometric mean operators 511, second-stage geometric mean operators 517, and third-stage geometric mean operator 523, these stages can be implemented in a single stage. For example, an aggregated stage 519 may perform equivalent functions of first-stage geometric mean operators 511 and second-stage geometric mean operators 517. In such embodiments, aggregated stage 519 may include circuitry to perform the aggregated operations. For example, in certain embodiments aggregated stage 519 includes a CMOS square-root circuit configured in a loop, in which the output of the CMOS square-root circuit is routed back to one of the inputs of the CMOS square-root circuit to perform the calculation of a square root of a product at least two times. Alternatively, aggregated stage 519 includes logic circuitry to perform an equivalent operation of first-stage geometric mean operators 511 and second-stage geometric mean operators 517 in a single stage. Further, aggregated stage 519 may include a processor configured to compute cascading geometric averages to effectively perform the functions of the first-stage and second-stage geometric mean operators.

Memory units 502 may include different types of memory types. For example, memory units 502 may include ReRAM memory units such as the ones previously described before in connection with FIG. 3C. In addition, memory units 502 may be part of ReRAM array 314. However, in other embodiments, memory units 502 may be flash, PCM, MRAM, or FeRAM memory units. For example, memory units 502 may include flash memory cells in which the transistors are controlled by gate voltage to act as a resistance.

In some embodiments, memory units 502 are coupled with filtering circuits 505. Filtering circuits 505 include hardware to process analog signals received from memory units 502. Filtering circuits may be desirable when readings from memory units are subject to noise sources that can obfuscate the read, such as the clock signal, or when pre-processing data would facilitate the later clustering of data. Multiple filtering techniques may be incorporated in memory read configuration 500.

As shown in FIG. 5, filtering circuits 505 include bandpass filters (collectively designated 504) and min/max filters (collectively designated 506). These circuits may be configured to filter out noise from undesired frequencies or cut-off from outlier memory units 502. For example, bandpass filters 504 may be configured to filter out high frequencies that are not typical of reading memory units. In addition, when it is expected that the output of memory units 502 is within a range (e.g., such as 1-10 uA), if one of memory units 502 outputs a current outside the range, e.g., 100 uA, this is an indication that the memory unit is malfunctioning. In order to prevent an outlier reading undermining the accuracy of the memory state determination, min/max filter 506 may truncate or eliminate any unexpected value. In this example, the unexpected current of 100 uA may be truncated down to the maximum expected current of 10 uA. Alternatively, min/max filter 506 may completely eliminate the unexpected current. Means for performing the band-pass filter operation of band-pass filters 504 and the min/max filtering of min/max filters 506 will be later described in greater detail in connection with FIGS. 10 and 11.

First-stage geometric mean operators 511 include hardware to process signals coming from memory units 502. As shown in FIG. 5, first-stage geometric mean operators 511 are coupled to the memory units 502 via filtering circuits 505. However, in other embodiments, first-stage geometric mean operators 511 may be directly connected to memory units 502. In addition, in certain embodiments, first-stage geometric mean operators 511 may be coupled, directly or indirectly, to read circuit 540, so that memory read configuration 500 only includes a single stage of geometric read operators.

In some embodiments, geometric mean operators 511 are organized in subsets, each subset being coupled to a specific group of memory units 502. For example, referring to FIG. 5, a first subset of geometric mean operators 511 includes the two top geometric mean operators 511(a) and 511(a+1). Therefore, the first subset of geometric mean operators 511 would be coupled, and configured to process readings from, a group of memory units including 502(a), 502(a+1), 502(a+2), and 502(a+3). Similarly, a second subset of geometric mean operators 511 includes the bottom two geometric mean operators 511(y) and 511(y−1). Thus, the second subset of geometric mean operators 511 is coupled, and configured to process readings from, a group of memory units including 502(z), 502(z−1), 502(z−2), and 502(z−3). Additional subsets of geometric mean operators 511 may be added to memory read configuration 500 depending on the number of memory units 502 that will be processed.

By organizing geometric mean operators 511 in subsets, memory read configuration 500 has the ability to identify regions of the memory with poor characteristics and disconnect them by disabling subsets of geometric mean operators 511. For example, in some memory chips, memory units 502 that are underperforming are concentrated in a specific region of the chip. The described organization of subsets of geometric mean operators 511 would allow isolating defective regions and improve memory reading accuracy.

First-stage geometric mean operators 511 may receive signals from multiple memory units 502 and process them to output a single signal. In some embodiments first-stage geometric mean operator 511 may multiply and then take a root of currents from memory units 502. For example, if each first-stage geometric mean operator 511 is coupled to two memory units 502, each first-stage geometric mean operator 511 generates an output current with the following relation $I_{out}=\sqrt{I_1 * I_2}$. Alternatively, each first-stage geometric mean operator 511 may receive currents from multiple memory units 502 and combine them together in a single computational operation. For example, each first-stage geometric mean operator 511 may receive currents from four memory units 502 and perform the operation $I_{out}=\sqrt[4]{I_1 * I_2 * I_3 * I_4}$. That is, in general, each first-stage geometric mean operator 511 can be configured to determine the geometric mean of a plurality of currents from memory units 502, where the geometric mean is given by $$\text{Geometric Mean} = \left(\prod_{i=1}^{n} a_i\right)^{1/n} = \sqrt[n]{a_1 * a_2 * \ldots * a_n}.$$

Thus, if each first-stage geometric mean operator 511 is coupled to two memory units 502 (n=2), the geometric mean is equivalent to taking the square-root of the product of two read currents respectively associated with the two memory units.

In other embodiments, first-stage geometric mean operators 511 may be substituted or reconfigured to apply other averaging operations. For example, first-stage geometric mean operators 511 may be substituted by, or reconfigured as, first-stage averaging operators that are configured to calculate an arithmetic mean of read currents associated with memory units 502. Alternatively, first-stage geometric mean operators 511 may be substituted by, or reconfigured as, first-stage multiplying circuits or first-stage adders, that combine currents from memory units 502 with different operations.

In some embodiments, as shown in FIG. 5, first-stage geometric mean operators 511 may be constructed with independent first-stage multiplying circuits (collectively designated 508) connected to first-stage root circuits (collectively designated 510). However, in other embodiments, a single circuit, such as a CMOS square-root circuit, may individually process currents from memory units 502. Exemplary implementations of first-stage multiplying circuits 508 and first-stage root circuits 510 and means for performing these operations will be further described in connection with FIGS. 7 and 8.

For memory read configuration 500 with many stages, the original signal from memory units 502 may be deteriorated as it passes through the different processing stages. For example, losses in conductors or noise from electronic components may corrupt the signals that are being processed. In addition, with multiple stages the apparent impedance seen by certain components in memory read configuration 500 may cause malfunctions. For example, the operation of first-stage geometric mean operators 511 may be compromised if they are connected to many stages that result in a high output impedance. Therefore, in some embodiments memory read configuration 500 may include first-stage buffer circuits 512 that serve to restore the quality of the signals and/or decouple portions of the circuit to prevent such issues. First-stage buffer circuits 512 may be configured with analog or digital circuits that are further described in connection with FIG. 9.

As previously discussed, memory read configuration 500 may include multiple data processing stages. FIG. 5 shows three data processing stages that include second-stage geometric mean operators 517, second-stage buffer circuit 518, third-stage geometric mean operator 523, and third-stage buffer circuit 524. In some embodiments, higher order stages may duplicate the hardware used in lower stages. For example, second-stage geometric mean operators 517 and third-stage geometric mean operator 523 may replicate the first-stage geometric mean operators 511. However, in other embodiments there may be differences between the components of each stage. For example, while first-stage geometric mean operators 511 may be configured to process two currents, second-stage geometric mean operators 517 may be configured to simultaneously process four or more currents. Additionally, or alternatively, while first-stage geometric mean operators 511 may be analog circuits, third-stage geometric mean operators 523 may be digital circuits.

Second-stage geometric mean operators 517 include second-stage multiplying circuits (collectively designated 514) and second-stage root circuits (collectively designated 516). Similarly, third-stage geometric mean operator 523 includes a third-stage multiplying circuit 520 and a third-stage root circuit 522. These multiplying and root circuits may also be designed with circuits further described in connection with FIGS. 7 and 8.

Memory read configuration 500 may include more than the three stages shown in FIG. 5. For example, memory read configuration 500 may have "k" stages, where k is any integer number. In such embodiments, the relationship between the number of memory units 502 and the number of the geometric mean operators may be defined by the selected number of stages. For example, in some embodiments with K stages the total number of memory units is $2^k$, while the total number of geometric mean operators is $2^k-1$. Thus, if memory read configuration 500 has 10 stages (k=10), the total number of memory units that will be processed in groups to determine an overall memory state is $2^{10}$ and the total number of geometric mean operators would be $2^{10}-1$. This relationship results from having replicated root stage operators and each stage operator processing two currents or signals. However, other relationships are possible when the geometric mean operators are not the same or may handle more than two currents.

After signals coming from the multiple memory units 502 are processed in the processing stages, a resulting current is transmitted to read circuit 540. For example, the last geometric mean operator stage may output a processed current that is transmitted to read circuit 540 via data connection 530. Alternatively, coupling between memory units 502 and read circuit 540 may be indirect, passing through additional electronic components such as filters or amplifiers. In some embodiments, read circuit 540 may include hardware and software that determines a memory state depending on the read current. For example, read circuit 540 may include hardware that determines one of a low resistive state or a high resistive state depending on the read current. In other embodiments, read circuit 540 may include a processing unit that operates based on the current received from memory units 502. For example, read circuit 540 may be coupled to one or more of neurons 202.

Read circuit 540 provides means for determining a memory state of the plurality of memory units based on a memory current. In some embodiments, read circuit 540 may include a computer processor that correlates a read current with a memory state. For example, read circuit 540 may correlate a read current with low, intermediate, or high resistance memory states. Alternatively, or additionally, read circuit 540 may be coupled with one or more of neurons 202. However, in other embodiments, read circuit 540 may include a CPU or a GPU. In addition, the means to determine a memory state based on a memory current may include a microprocessor, a microcontroller, or other equivalent processing unit, to associate the current with a memory state.

Figure 6:
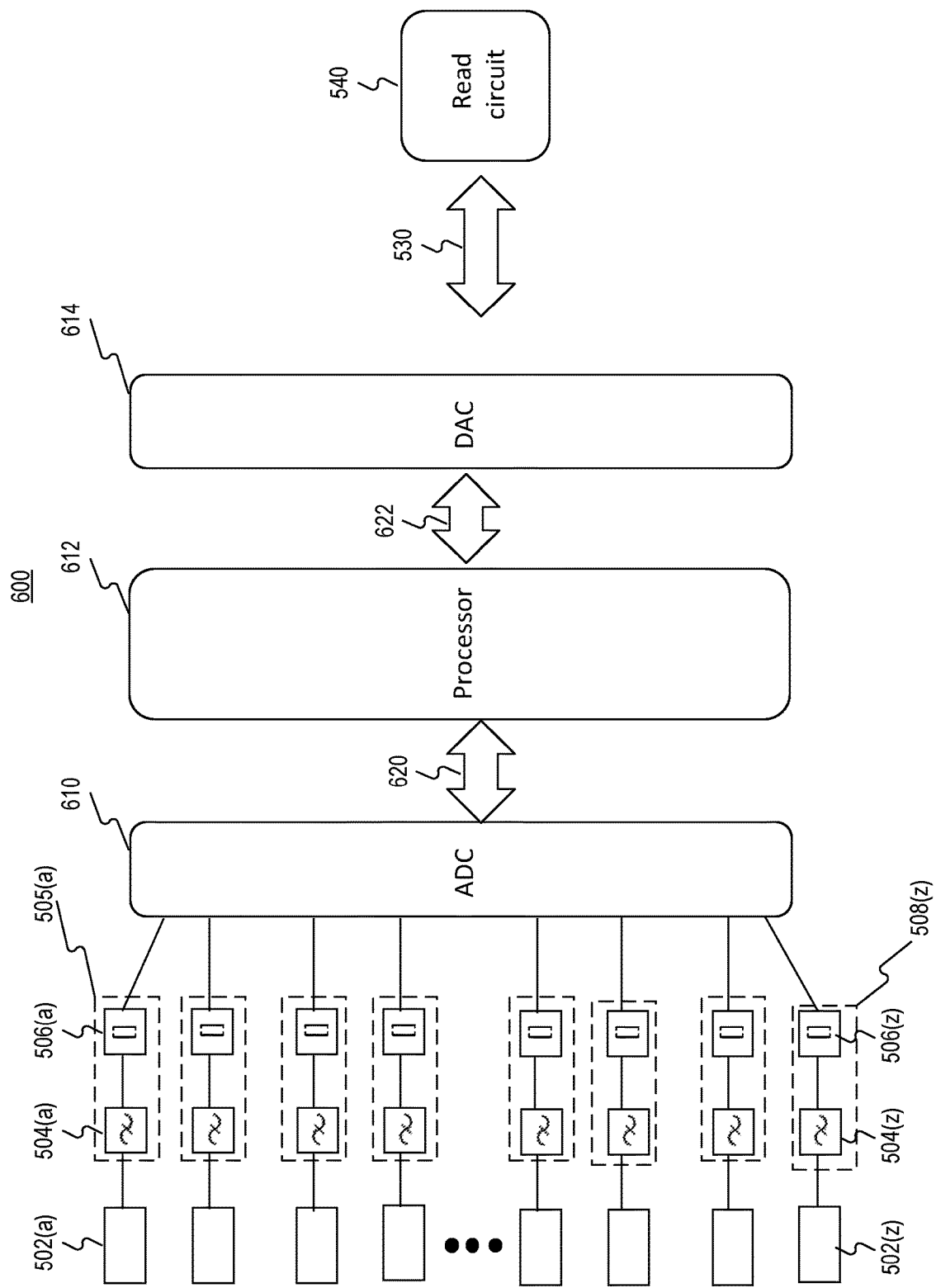
FIG. 6 is a schematic diagram of a second exemplary memory read configuration.

FIG. 6 is a schematic diagram of a second exemplary memory read configuration 600. Like memory read configuration 500, memory read configuration 600 is configured to cluster the output of multiple memory units to reduce the deviation of each memory state distribution. In memory read configuration 600, combining multiple memory reads creates memory state distributions with lower max/min ratios per state, thereby facilitating determination of the memory state.

Memory read configuration 600 includes memory units 502 and filtering circuits 505. However, instead of having the several stages of geometric mean operators and buffers of memory read configuration 500, memory read configuration 600 includes an analog-to-digital converter (ADC) 610, a processor 612, and a digital-to-analog converter (DAC) 614. The configuration of memory read configuration 600 enables digital processing of read currents from memory units 502.

As shown in FIG. 6, memory units 502 are coupled to ADC 610, process 612, and DAC 614. ADC 610 transforms the analog signals from memory units 502 into digital data. In some embodiments ADC 610 may be configured with a high-speed converter operating in a GHz input bandwidth. In some embodiments, the number of input pins to ADC 610 may equal the number of memory units being clustered. However, in other embodiments ADC 610 may include parallel to serial converters and have a lower number of input pins.

Digitized data from ADC 610 is transmitted to processor 612 which may calculate an output value. Processor 612 may include any computing unit, such as a CPU or a GPU. Processor 612 receives all the digitized data to calculate an output. For example, processor 612 may operate on the digitized current values to calculate a geometric mean of currents. Thus, processor 612 may multiply current values and then take a root of the product. Alternatively, processor 612 may calculate arithmetic averages, summations, and/or products from the digitized current values. Processor 612 may also calculate other values based on the digitized currents. For example, processor 612 may calculate a mode and/or a median of currents.

Processor 612 transmits the calculated value to DAC 614. DAC 614 may include any digital to analog converter. DAC 614, however, may be selected based on figures of merit including: resolution, maximum sampling frequency, etc. DAC 614 converts the calculated digital signal to an analog signal that is then transmitted to read circuit 540.

While FIG. 6 shows ADC 610, processor 612, and DAC 614 as independent units connected via buses 620 and 622, in some embodiments all the functions of these three elements may be performed within a single unit. For example, ADC, processing, and DAC, operations may be performed by a single component, such as a CPU or GPU.

Figure 7:
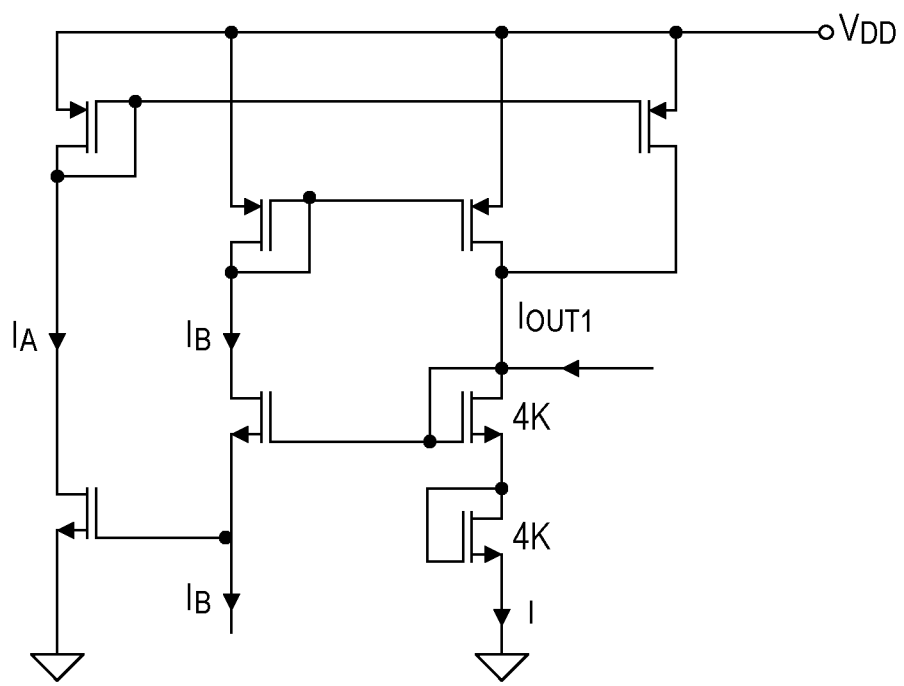
FIG. 7 is a circuit diagram of an exemplary geometric mean operator.

FIG. 7 is a circuit diagram of an exemplary geometric mean operator 700. In some embodiments, geometric mean operator 700 may be used to assemble geometric mean operators 511, 517, and 523 shown in FIG. 5. In other embodiments, geometric mean operator 700 may be included as part of root circuits 510, 516, and 522 of FIG. 5.

Geometric mean operator 700 includes a plurality of MOS transistors in the configuration shown in FIG. 7, creating a CMOS square-root circuit. Transistors in geometric mean operator 700 may be biased so an output current of the circuit (Iout) is proportional to the square root of the product of two input currents (Ia) and (Ib). For example, geometric mean operator 700 may be configured to output $I_{out}=2\sqrt{I_A I_B}$. Other equivalents of geometric mean operator 700 may include circuits with operational amplifiers that multiply and take the square root of two current signals. Yet other equivalents of geometric mean operator 700 may include digital circuits that digitize signals to calculate the root of the signals. For example, equivalents of geometric mean operator 700 may include digital signal processors. Moreover, equivalents of geometric mean operator 700 may include other analog circuits that output a value proportional to the square of the inputs.

Geometric mean operator 700, and its equivalents, may provide means for generating a plurality of first roots by performing root operations. In addition, geometric mean operator 700, and its equivalents, may provide means for generating a second root by performing a root operation.

Figure 8:
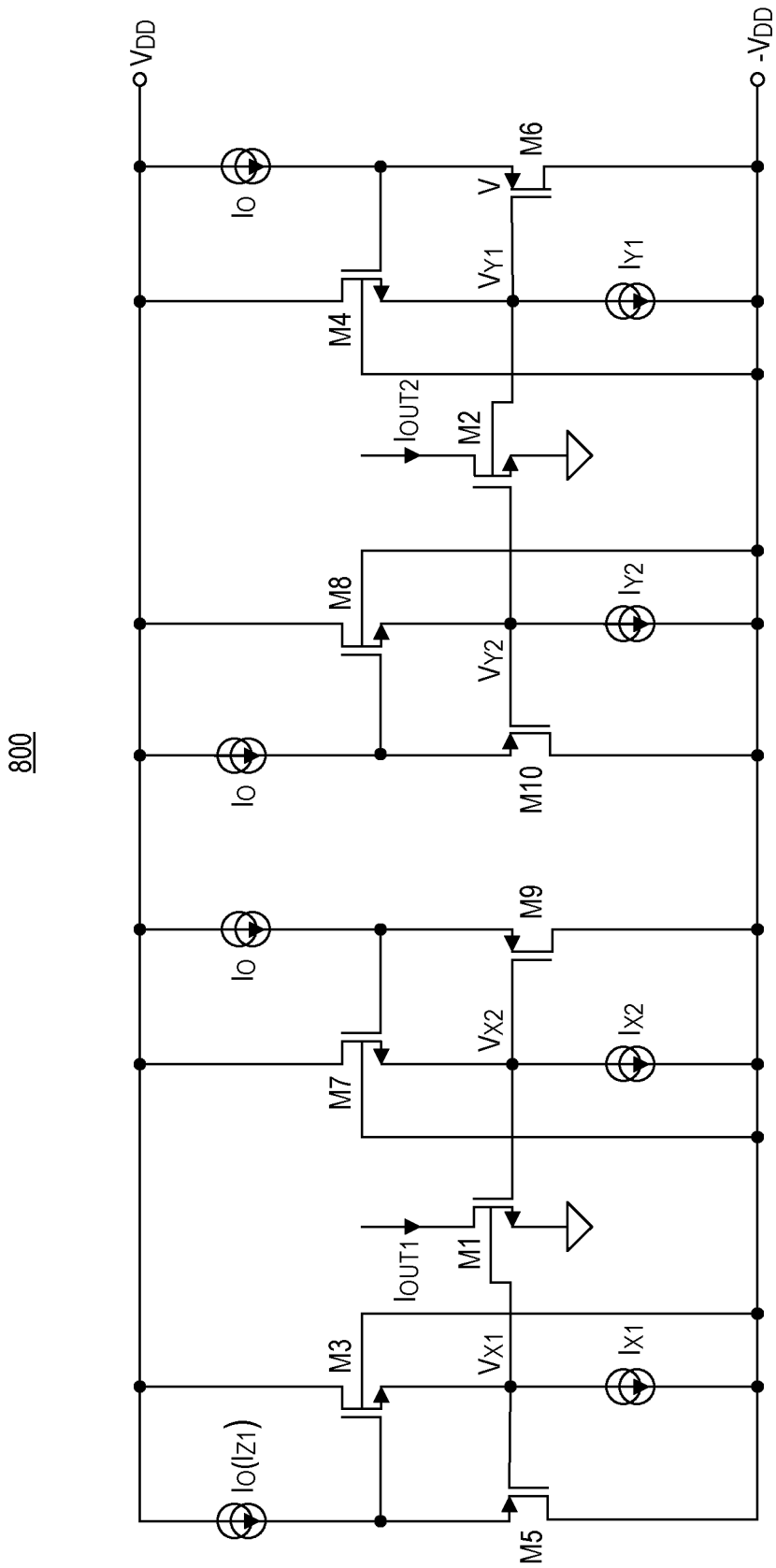
FIG. 8 is a circuit diagram of an exemplary multiplying circuit.

FIG. 8 is a circuit diagram of an exemplary multiplier 800. Multiplier 800 may be used as multiplying circuits 508, 514, and 520 of FIG. 5.

Multiplier 800 includes a plurality of bulk-driven sub-threshold-operated MOS transistors. The transistors in multiplier 800 are configured to provide the following relationship between input and output currents:

$$\frac{I_{out1}}{I_{out2}} = \frac{I_{y1}}{I_{x1}} \left( \frac{I_{y2}}{I_{x2}} \right)$$

Multiplier 800 allows a user to multiply or divide currents as needed. For example, a user desiring to compute the product of $I_{y1}$ and $I_{y2}$ may configure the circuit to have currents in the denominator ($I_{x1}$ and $I_2$) being equal to 1, or another nominal value, by connecting in series a current source with the desired current. Alternative configurations of multiplier 800 are possible to calculate the product of two or more currents. Other equivalents of multiplier 800 may include circuits with operational amplifiers that multiply two signals. Yet other equivalents of multiplier 800 may include digital circuits that digitize signals to calculate the product of signals. For example, equivalents of multiplier 800 may include digital signal processors. Moreover, equivalents of multiplier 800 may include other voltage and current multiplying analog circuits receiving as inputs two currents and producing an output current proportional to the product of the input currents.

Multiplier 800, and its equivalents, provide means for generating a plurality of first products by multiplying memory read currents associated with memory units 502. In addition, multiplier 800, and its equivalents, provide means for generating a second product by multiplying a first subset of the plurality of first roots. Further, multiplier 800, and its equivalents, provide means for generating a fourth product by multiplying the second root and the third root.

Figure 9:
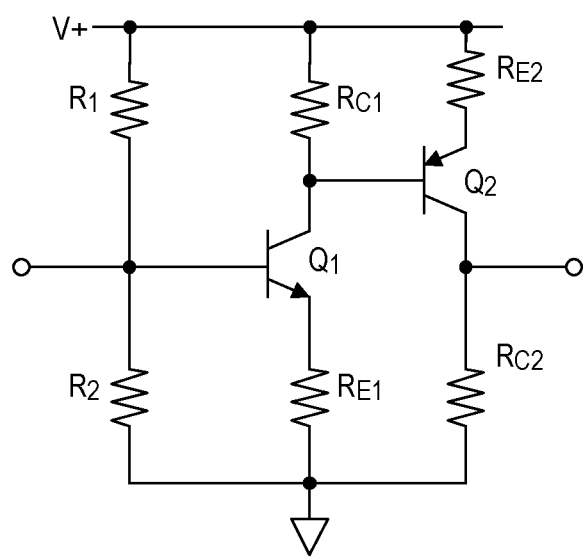
FIG. 9 is a circuit diagram of an exemplary buffer.

FIG. 9 is a circuit diagram of an exemplary buffer 900. Buffer 900 may be used as buffer circuits 512, 518, and 524, in FIG. 5.

Buffer 900 includes transistors and a series of resistances calibrated to replicate an input signal in an output node but decoupling the signal from the output impedance to prevent issues caused by large resistances or circuit loads. As shown in FIG. 9, buffer 900 includes a common emitter amplifier followed by a common collector. Gain resistances in buffer 900 may be calibrated so buffer 900 has no gain but simply replicates the input signal, while providing a near voltage-source (low resistance) output. In buffer 900, a high input resistance makes the input signal nearly independent of input-source resistance. Therefore, buffer 900 can decouple the output impedance to prevent malfunctioning when there are multiple stages in memory read configuration 500. Moreover, buffer 900 may be configured in several stages to reduce attenuation due to inter-stage loading.

Equivalents of buffer 900 may include circuits with operational amplifiers that drive signals without amplification. Yet other equivalents of buffer 900 may include digital circuits that digitize signals to calculate an equivalent analog signal. Moreover, equivalents of buffer 900 include other configurations, such as a two-stage cascade buffer, coupled common emitter stages, complementary pair amplifiers, etc.

Buffer 900, and its equivalents, provide means for generating a buffered signal.

Figure 10A:
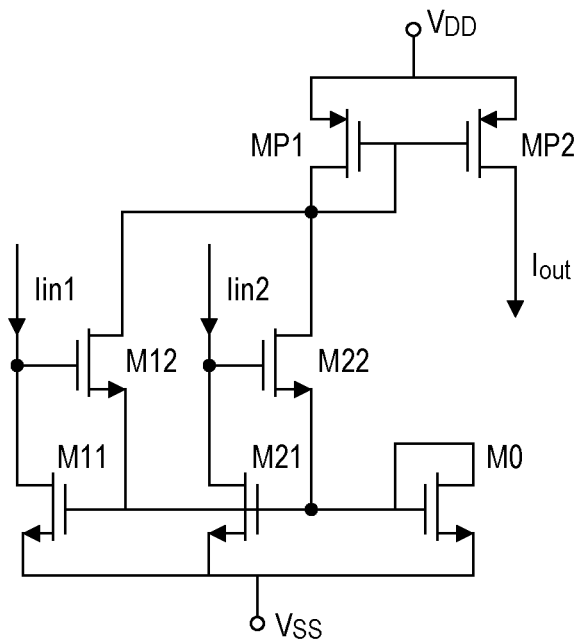
FIG. 10A is a circuit diagram of an exemplary max filter.
Figure 10B:
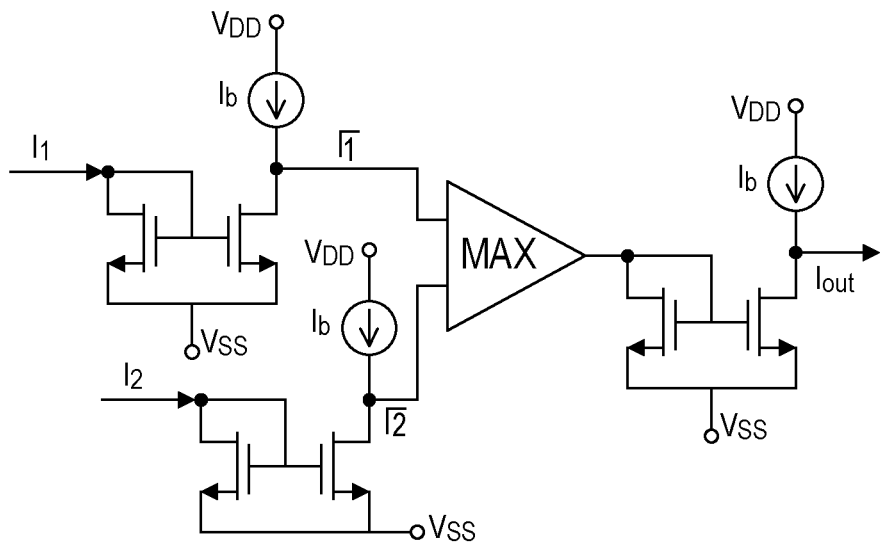
FIG. 10B is a circuit diagram of an exemplary min filter.

FIGS. 10A and 10B are circuit diagrams of exemplary min/max filters. FIG. 10A shows a current maximum selector 1010 and FIG. 10B shows a current minimum selector 1020. In some embodiments, a combination of current maximum selector 1010 and current minimum selector 1020 may be used to build mix/max filters 506 in FIGS. 5 and 6.

Current maximum selector 1010 identifies a maximum current based on interconnection of two cells. The cells respectively contain transistors M11-M12 and M21-M22. A result of competition between the two cells connected by gates of transistor M11 and M21, is a shared gate voltage corresponding to a saturation value imposed by a maximum input current. Thus, current maximum selector 1010 provides a maximum current, which is transformed to a current source and then duplicated by using appropriate current mirroring. In some embodiments, a user may employ current maximum selector 1010 to discard currents below a lower limit. For example, if current reads from memory units 502 are expected to be between 1-10 uA but the current is 0.5 uA, current maximum selector 1010 may be used to select a current of 1 uA, truncating outlier values.

Current minimum selector 1020 is based on a modification of current maximum selector 1010. The operation of current minimum selector 1020 is similar by having transistors connected via a shared gate voltage corresponding to a saturation value. However, in current minimum selector 1020 an operational amplifier is used to invert the selection based on De Morgan's law. The current minimum selector 1020 is used to truncate any value that is above an acceptable threshold.

In conjunction, current maximum selector 1010 and current minimum selector 1020 may be configured to create a min/max filter that serves to eliminate or truncate outlier values that affect the operation of memory read configuration 500. Other equivalents of current maximum selector 1010 and current minimum selector 1020 include circuits with operational amplifiers that compare and select the magnitude of signals. Yet other equivalents of current maximum selector 1010 and current minimum selector 1020 include digital circuits that digitize signals to calculate minimums and maximums. Moreover, equivalents of current maximum selector 1010 and current minimum selector 1020 include other analog circuits with different configurations for identifying and selecting values based on their amplitude.

Current maximum selector 1010 and current minimum selector 1020, or their equivalents, provide means for performing a min/max filtering of signals.

Figure 11:
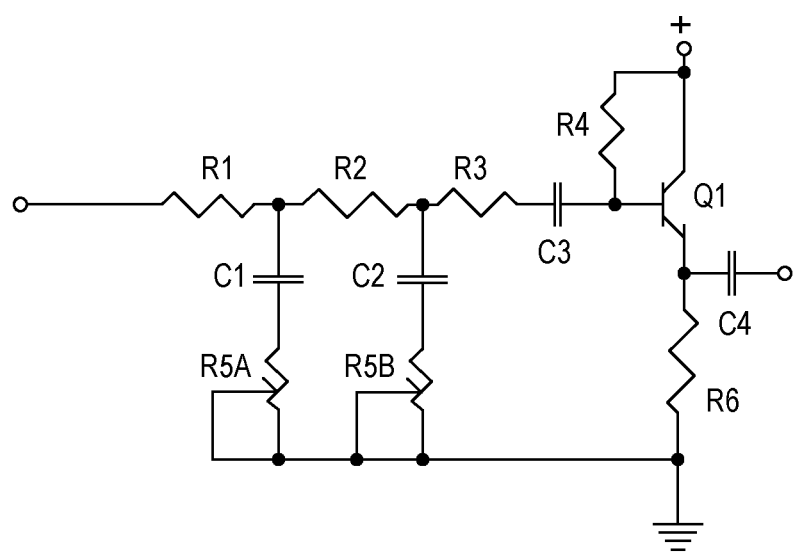
FIG. 11 is a circuit diagram of an exemplary low band pass filter.

FIG. 11 is a circuit diagram of an exemplary band pass filter 1100. In some embodiments, band pass filter 1100 may be used to configure band pass filters 504 of FIGS. 5 and 6.

Band pass filter 1100 includes resistors, capacitors, and transistors configured as shown in FIG. 11. The configuration of band pass filter 1100 results in negative feedback from an output of to the input. This configuration provides a Butterworth response with maximum flatness within the pass-band. In addition, band pass filter 1100 may be configured to have a quick roll off between passing and filtered frequencies. Equivalents of band pass filter 1100 include circuits with operational amplifiers that filter a frequency or select a frequency. Other equivalents of band pass filter 1100 include digital filters. Moreover, equivalents of band pass filter 1100 may include other analog filtering circuits such as resonant filters.

Band pass filter 1100, and it equivalents, may provide means for filtering a signal. For example, band pass filter 1100, and its equivalents, provide means for filtering currents from memory units 502.

Figure 12:
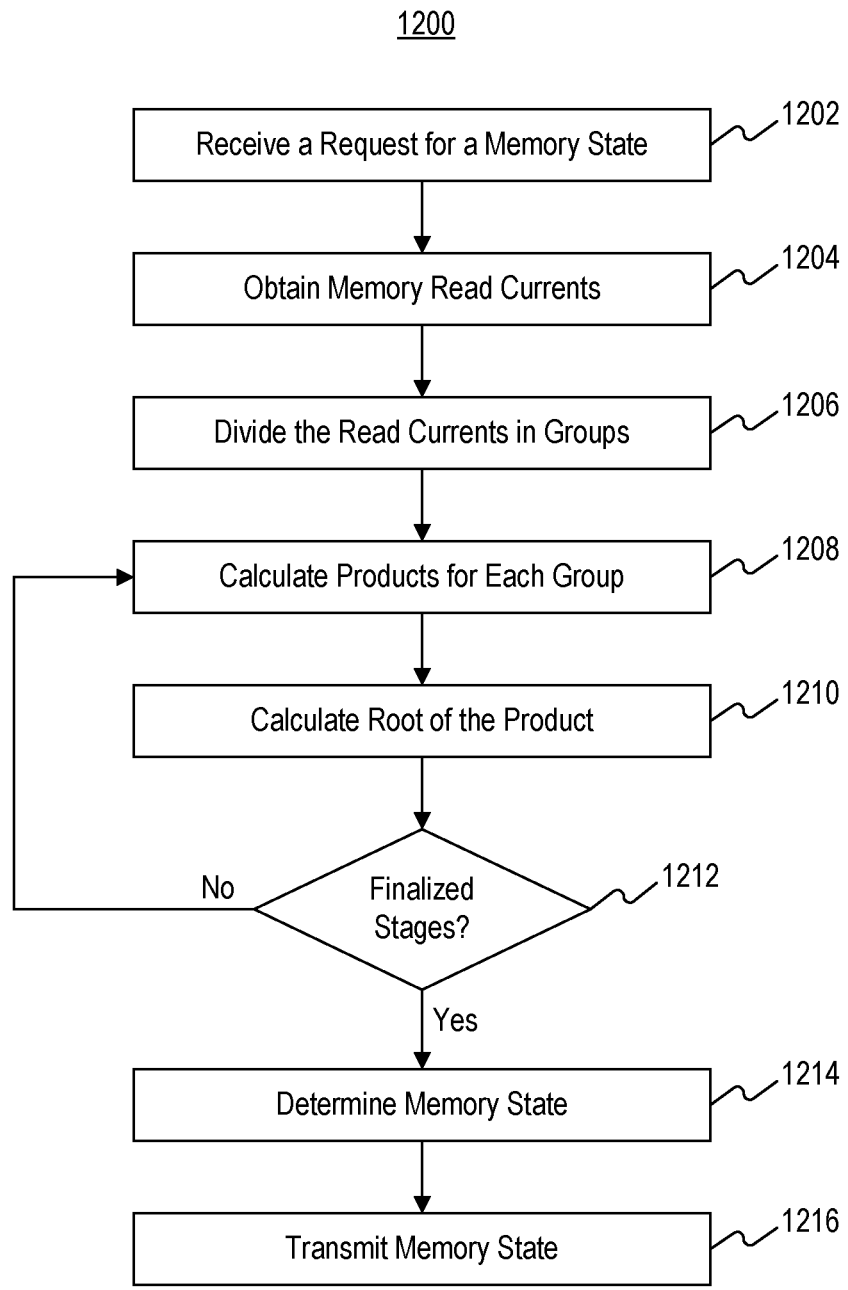
FIG. 12 is a flowchart illustrating an exemplary memory state determination method according to a disclosed embodiment.

FIG. 12 is a flowchart illustrating an exemplary memory state determination method 1200. In some embodiments, method 1200 may be executed by the sequence of processing stages presented in memory read configuration 500. However, in other embodiments method 1200 may be implemented by a single component. For example, method 1200 may be implemented by processor 612.

In step 1202, a request to determine a memory state is received. For example, one of neurons 202 may require a memory state to perform a calculation and transmit a request for a memory state. The request may specify a group of memory units that should be queried.

In step 1204, a plurality of memory read currents are obtained from memory units. In some embodiments, a plurality of memory read currents are obtained from memory units 502. The memory read currents may be filtered to eliminate noise from undesired frequencies or to truncate outlier values. To further explain method 1200 with an algebraic example, an exemplary plurality of memory read currents obtained in step 1204 are referred to as currents A, B, C, and D.

In step 1206, the plurality of memory read currents are divided into different groups. In some embodiments, the memory read currents may be divided into groups of two memory read currents per group. Alternatively, divided groups of more than two memory read currents may be defined in step 1206. For example, continuing with the example of currents A, B, C, and D, the divided groups may be Group 1 {A, B} and Group 2 {C, D}.

In step 1208, elements in each one of the divided groups are multiplied to calculate a product associated with each one of the divided groups. For example, if each group has two memory read currents, a product of the two memory read currents is calculated. Thus, for example, in step 1208 products for {A*B} and {C*D} are calculated.

In step 1210, the root of the products is calculated. For example, each one of the products calculated in step 1208 is calculated to generate a geometric mean. Thus, for example, in step 1210 the following roots are calculated $\{A*B\}^{1/2}$ and $\{C*D\}^{1/2}$.

In step 1212, it is determined whether all processing stages have been finalized. For example, in a case in which there are K stages, method 1200 returns to step 1208 to calculate additional products if the K stages have not been completed (step 1212: no). However, if the K stages have been completed (step 1212: yes), method 1200 continues to step 1214. The algebraic example with currents A, B, C, and D, has 2 stages (K=2). Therefore, in the example, the method would return to step 1208 to calculate a new product of $[\{A*B\}^{1/2}*\{C*D\}^{1/2}]$ and then calculate a square root of the second-stage product $[\{A*B\}^{1/2}*\{C*D\}^{1/2}]^{1/2}$ in step 1210. If there are more stages, the cycle between steps 1208 and 1212 continues until a single current represents all the clustered memory units.

In step 1214, a memory state is determined based on the single representative current determined in the cycle of steps of 1208-1212. For example, in some embodiments it may be determined that the memory state is high-resistance when the memory current is below a first reference current; the memory state is a first intermediate state when the memory current is between the first reference current and a second reference current, the second reference current being greater than the first reference current; the state is a second intermediate state when the memory current is between the second reference current and a third reference current, the third reference current being greater than the second reference current; and the memory state is a high-resistance state when the memory current is above the third reference current. In such embodiments, a memory reader may, for example read circuit 540, selects the first reference current to be higher than a maximum current in a distribution of memory currents associated with the low-resistance state; and selects the third reference current to be lower than a minimum current in a distribution of memory currents associated with the high-resistance state. Therefore, the memory reader would be able to associate memory currents with a memory state by comparing memory reads from clustered memory units 502 with the reference currents.

To determine a memory state a processing circuit may correlate the memory output with a memory state. For example, in step 1214 an analog-to-digital converter (ADC) may determine one of the states based on the current input. The ADC may determine that any current below a first reference number corresponds to a low memory state while a current above a third reference number corresponds to a high memory state. Therefore, means for determining a memory state of the plurality of memory units may include an ADC that correlates analog signals with a memory state. Alternatively, the memory state may be identified with a processing unit, such as a microprocessor, that correlates a received analog input with a memory state.

In step 1216, the determined memory state is transmitted to a processing unit, coupled directly or indirectly. For example, the determined memory state may be transmitted to one of neurons 202 for processing tasks or computations. While method 1200 has been described for a group of four memory currents processed in two stages, method 1200 may also be used to process more than two memory read currents in each state. A numeric example applying method 1200 with multiple memory read currents per stage is described next.

According to the numeric example, in step 1204 read operation begins with eight memory units 502 outputting the following values: 8, 10, 9, 12, 7, 8, 9, and 10 uA. These initial values may be obtained by a processing circuit or the network shown in FIG. 5. Then, these values are divided into two groups of four values each (step 1206) and they are then processed to obtain a geometric mean. For example, the following operations are performed according to steps 1208 and 1210 of method 1200: $(8\times10\times9\times12)^{1/4}=9.6$ uA and $(7\times8\times9\times10)^{1/4}=8.4$ uA. The numeric example shows how the max/min ratio may be reduced with the disclosed processing techniques. While the initial values had a broad distribution ranging from 7-12 uA, with a differential of 5 uA, the processed data has a max/min ratio of only 8.4-9.6 uA, a differential of 1.2 uA. Therefore, the max/min ratio decreased, and a memory state associated with the distribution will be easier to identify.

Figure 13A:
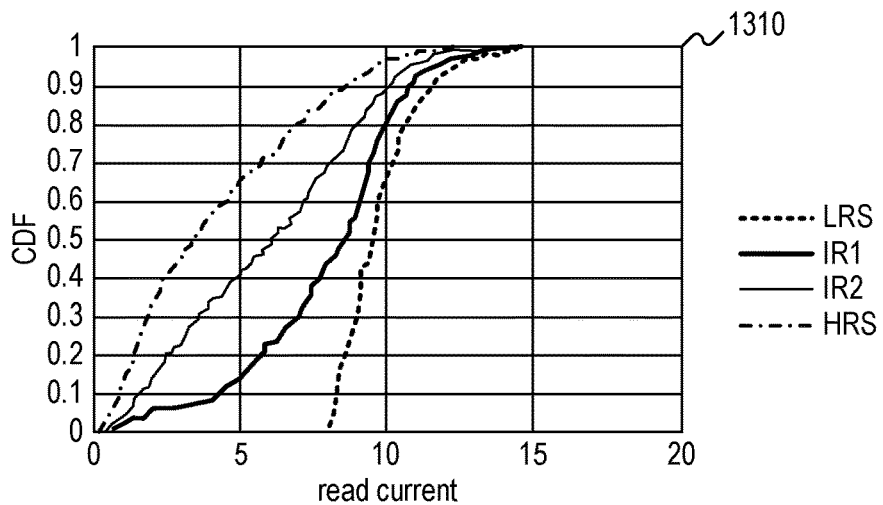
FIG. 13A is a graph of a first exemplary relationship between a cumulative distribution function and a read current for different memory states.
Figure 13B:
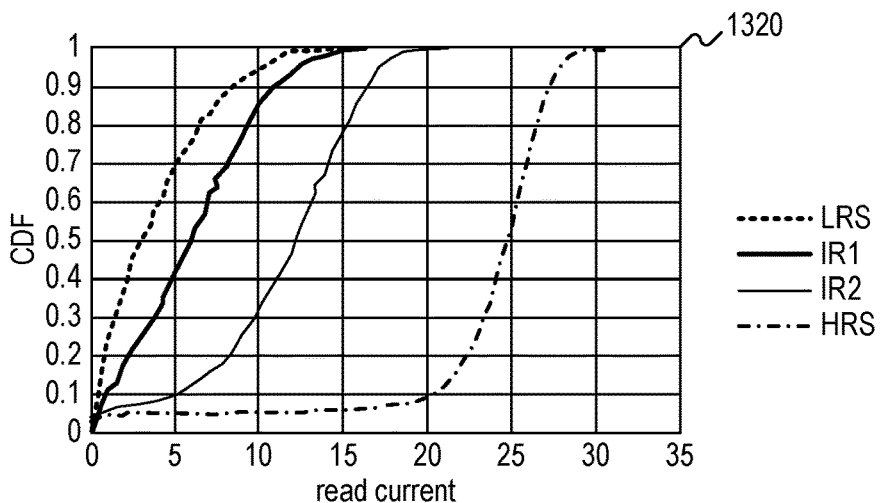
FIG. 13B is a graph of a second exemplary relationship between a cumulative distribution function and a read current for different memory states.
Figure 13C:
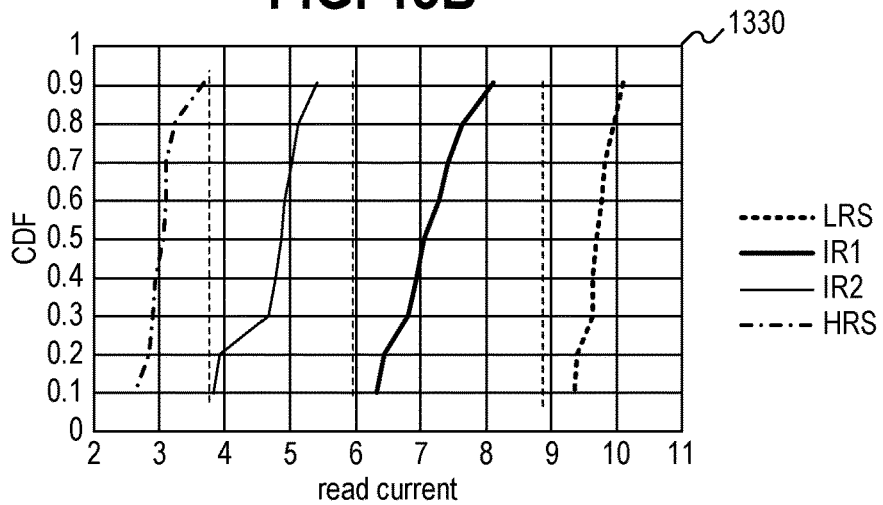
FIG. 13C is a graph of a third exemplary relationship between a cumulative distribution function and a read current for different memory states.

FIGS. 13A-13C illustrate graphs showing exemplary relationships between a cumulative distribution function (CDF) and read current for different memory states of a plurality of memory units.

With reference to FIG. 13A, graph 1310 shows the relationship between read current and a cumulative distribution function for a low resistance state (LRS), a first intermediate state (IR1), a second intermediate state (IR2), and a high resistance state (HRS). Graph 1310 shows significant overlap between the four states. For instance, a read current of 10 uA may be representative of all states. This overlap between distributions complicates read operations because it creates uncertainty as to the corresponding state of the memory unit.

With reference to FIG. 13B, graph 1320 presents a second relationship between read current and the cumulative distribution function after some processing and amplification or using a different read operation. While the overlap between distributions is reduced, determining memory states is still challenging because the distributions overlap and there is no clear division between upper and lower bounds of adjacent memory states. As shown in graph 1320, there is overlap among the different memory state. Therefore, at a given read current (e.g., 5 uA), it is not possible to distinguish among the different states. The memory read method that provided the results of graph 1320 may be used reliably for only two states of low-resistance and high-resistance. However, using only two states exponentially diminishes storage capacity.

With reference to FIG. 13C, graph 1330 presents a third relationship between read current and the cumulative distribution function. The relationship shown in graph 1330 may be obtained after the memory state is processed with method 1200 and/or using memory read configurations 500 or 600. To obtain graph 1330, multiple memory units are clustered before performing the memory read. For example, data processing techniques such as determining the geometric mean have been applied to obtain the relationship represented in graph 1330.

Graph 1330 shows each memory state has clearly defined upper and lower bounds. For example, it is clear that any current below 3 uA should be associated with an HSR while any current above 9 uA should be associated with an LSR. Then, the processing techniques of clustering memory units generate clear distributions with easily distinguishable memory states. As presented in graph 1330, with the disclosed clustering method the cumulative distribution functions between different states do not overlap and the min/max ratio is significantly reduced. Therefore, different read currents can be easily correlated with a specific memory state.

The clustering method used to generate the third relationship in graph 1330 improves the distribution of memory reads and facilitates using memory units for applications such as neuromorphic computing. With the disclosed processing methods there is no tail overlap between states creating a clear distinction between states of the memory units.

After the memory current is processed, the memory states in graph 1330 may be identified by means for determining a memory state. For example, a microcontroller may provide means for correlating the memory currents with a memory state. The microcontroller may include relation tables, or other correlational methods, to generate an output of a memory state based on a memory current.

Figure 14:
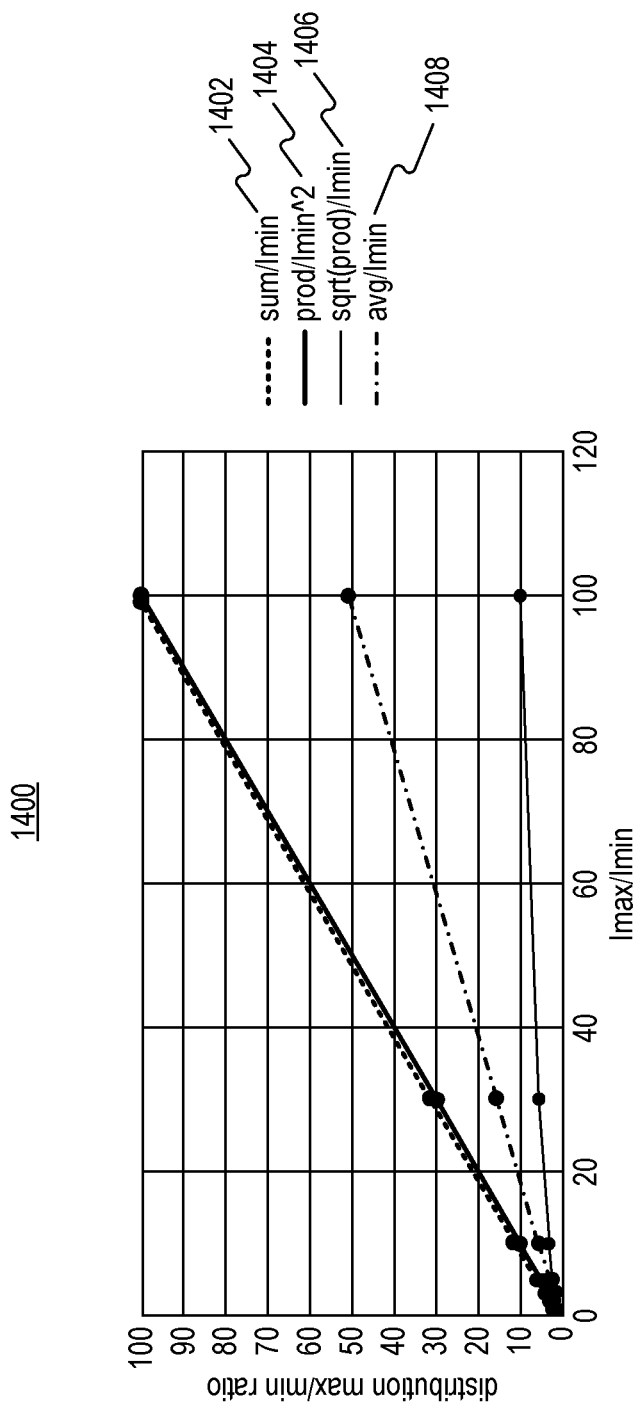
FIG. 14 is a graph of exemplary relationships between a current distribution as a function of a current ratio for different memory read configurations.

FIG. 14 is a graph 1400 showing exemplary relationships between a current distribution and current ratio for different memory read configurations. The distribution of max/min ratio is a metric of the standard deviation of a distribution. A high max/min ratio is associated with high standard deviations because the maximum and minimum numbers are far apart. In contrast, a low max/min ratio is associated with a compact distribution in which the maximum and minimum values are close to each other. For memory read operations it is desired to have a low max/min ratio. With a low max/min ratio the distribution of different memory states is narrow and does not include overlap between different memory states. For example, memory units that have a low distribution max/min ratio would be associated with the memory states presented in graph 1330.

Graph 1400 shows the max/min ratio for different clustering operations. Graph 1400 shows the results from memory read configurations that add, multiply, calculate an arithmetic average, or calculate a geometric mean of clustered memory units. Graph 1400 shows that adding or multiplying the memory currents and normalizing them with a minimum current, results in large max/min ratios. For example, in graph 1400 sum/I min 1402 and prod/I min$^2$ 1404 result in large max/min ratios These large max/min ratios are undesirable because they result in overlapping memory states. Graph 1400 also shows results of calculating an arithmetic average of a plurality of memory units with avg/I min 1408. With an averaging operation the max/min decreases, indicating narrower memory state distributions. For example, avg/I min 1408 results in a lower max/min ratio than sum/I min 1402 and prod/I min$^2$ 1404. However, the geometric mean operation desirably achieves an even lower max/min ratio. As shown in graph 1400 with sqrt (prod)/I min 1406 an operation of taking the square root of the product of read currents results in the lowest max/min ratio. With the square root of the product operation, the min/max ratio decreases allowing a simpler resolution of the memory states. For example, sqrt(prod)/I min 1406 has the lowest min/max ratio of all the clustering operations.

Operations in addition to the ones presented in graph 1400 may also be possible. Graph 1400 only shows the effect on the distribution standard deviation resulting from with different operations intended to reduce the numerical spread of read current. Other operations on clustered read currents, such as determining the mean or mode, may also be performed to reduce min/max ratios and facilitate memory read operations. Alternatively, multiple operations may be combined in a memory read configuration. For example, the averaging operation may be performed in some stages of the memory read configuration while the geometric mean operation may be performed in other stages of the configuration.

It will be apparent to those skilled in the art that various modifications and variations can be made to the disclosed system and related methods. Other embodiments will be apparent to those skilled in the art from consideration of the specification and practice of the disclosed system and related methods. It is intended that the specification and examples be considered as exemplary only, with a true scope being indicated by the following claims and their equivalents.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

What is claimed is:

1. A memory device, comprising:
    a plurality of memory units;
    a plurality of first-stage geometric mean operators, each one of the plurality of first-stage geometric mean operators being coupled to at least two of the plurality of memory units;
    at least one second-stage geometric mean operator coupled to at least two of the plurality of first-stage geometric mean operators; and
    a memory state reader coupled to the at least one second-stage geometric mean operator to read a memory state of the plurality of memory units.

2. The memory device of claim 1 wherein the plurality of memory units comprise ReRAM units.

3. The memory device of claim 1, wherein each one of the plurality of first-stage geometric mean operators and the at least one second-stage geometric mean operator comprise a CMOS square-root circuit.

4. The memory device of claim 1, wherein each one of the plurality of first-stage geometric mean operators comprises:
    a first-stage multiplying circuit coupled to the at least two of the plurality of memory units; and
    a first-stage root circuit coupled to the first-stage multiplying circuit.

5. The memory device of claim 4, wherein the at least one second-stage geometric mean operator comprises:
    a second-stage multiplying circuit coupled to the at least two of the plurality of first-stage geometric mean operators; and
    a second-stage root circuit coupled to the second-stage multiplying circuit.

6. The memory device of claim 1, further comprising an artificial neuron coupled to the memory state reader.

7. The memory device of claim 6, wherein
    the artificial neuron occupies an area at least one hundred times greater than each one of the plurality of memory units.

8. The memory device of claim 7, wherein
    the artificial neuron occupies an area of 8000 $F^2$ or more; and
    each one of the plurality of memory units occupies an area of 30 $F^2$ or less.

9. The memory device of claim 1, wherein the memory state reader is configured to:
    receive a memory current corresponding to the memory state based on an output of the second-stage geometric mean operator;
    determine the memory state of the plurality of memory units is in a high-resistance state when the memory current is below a first reference current;
    determine the plurality of memory units are in a first intermediate state when the memory current is between the first reference current and a second reference current, the second reference current being greater than the first reference current;
    determine the plurality of memory units are in a second intermediate state when the memory current is between the second reference current and a third reference current, the third reference current being greater than the second reference current; and
    determine the plurality of memory units are in a low-resistance state when the memory current is above the third reference current, the third reference current being higher than the first reference current.

10. The memory device of claim 9, wherein the memory state reader is further configured to:
    select the first reference current to be higher than a maximum current in a distribution of memory currents associated with the high-resistance state; and
    select the third reference current to be lower than a minimum current in a distribution of memory currents associated with the low-resistance state.

11. The memory device of claim 1, wherein
    the at least one second-stage geometric mean operator comprises two second-stage geometric mean operators; and
    the memory state reader is coupled to the two second-stage geometric mean operators through a third-stage geometric mean operator.

12. The memory device of claim of claim 1, further comprising a plurality of filter circuits, wherein
    each one of the plurality of first-stage geometric mean operators is coupled to the at least two of the plurality of memory units through at least one of the plurality of the filter circuits; and
    at least one of the plurality of filter circuits comprises a band-pass filter and a min/max filter.

13. The memory device of claim 1, further comprising a plurality of buffer circuits, wherein
    the at least one second-stage geometric mean operator is coupled to the at least two of the plurality of first-stage geometric mean operators through at least one of the plurality of the buffer circuits.

14. The memory device of claim 1, further comprising additional geometric mean operators,
    wherein
    the plurality of memory units comprises $2^K$ memory units; and
    a number of the plurality of first-stage geometric mean operators, plus a number of the at least one second-stage geometric mean operator, plus a number of the additional geometric mean operators is at least $2^K-1$.

15. A memory device comprising:
    a plurality of non-volatile memory units;
    means for generating a plurality of first products by multiplying memory read currents associated with the memory units;
    means for generating a plurality of first roots by performing root operations on the first products;
    means for generating a second product by multiplying a first subset of the plurality of first roots, the first subset comprising at least two of the plurality of first roots;
    means for generating a second root by performing a root operation on the second product; and
    means for determining a memory state of the plurality of memory units based on a memory current corresponding to the plurality of first roots and the second root.

16. The memory device of claim 15, further comprising:
means for generating a third product by multiplying a second subset of the plurality of first roots, the second subset comprising at least two of the plurality of first roots, the second subset being different from the first subset;
means for generating a third root by performing a root operation on the third product;
means for generating a fourth product by multiplying the second root and the third root; and
means for generating a fourth root by performing a root operation on the at least one fourth product;
wherein
the memory current is further based on the fourth root.

17. A method for determining a memory state, the method comprising:
obtaining a plurality of memory read currents from a plurality of memory units;
generating a plurality of first products by multiplying the plurality of memory read currents;
generating a plurality of first roots by performing root operations on the plurality of first products;
generating a second product by multiplying a first subset of the plurality of first roots, the first subset comprising at least two of the plurality of first roots;
generating a second root by performing a root operation on the second product; and
determining the memory state of the plurality of memory units based on a memory current, corresponding to the plurality of first roots and the second root, employing a memory state reader.

18. The method of claim 17, wherein
generating the plurality of first roots comprises determining square-roots of products of the plurality of memory read currents.

19. The method of claim 17, wherein determining the memory state comprises:
determining the memory state of the plurality of memory units is in a high-resistance state when the memory current is below a first reference current;
determining the plurality of memory units are in a first intermediate state when the memory current is between the first reference current and a second reference current, the second reference current being greater than the first reference current;
determining the plurality of memory units are in a second intermediate state when the memory current is between the second reference current and a third reference current, the third reference current being greater than the second reference current; and
determining the plurality of memory units are in a low-resistance state when the memory current is above the third reference current, the third reference current being higher than the first reference current.

20. The method of claim 17, further comprising:
transmitting, from the memory state reader, the memory state to an artificial neuron,
wherein the artificial neuron occupies an area at least one hundred times greater than each one of the plurality of memory units.

* * * * *